US010243127B2

United States Patent
Ren et al.

(10) Patent No.: US 10,243,127 B2
(45) Date of Patent: Mar. 26, 2019

(54) SYSTEMS AND METHODS OF FABRICATION AND USE OF NBFESB P-TYPE HALF-HEUSLER THERMOELECTRIC MATERIALS

(71) Applicant: University of Houston System, Houston, TX (US)

(72) Inventors: Zhifeng Ren, Houston, TX (US); Ran He, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 0 days.

(21) Appl. No.: 15/689,344

(22) Filed: Aug. 29, 2017

(65) Prior Publication Data

US 2018/0114889 A1  Apr. 26, 2018

Related U.S. Application Data

(63) Continuation-in-part of application No. 14/667,056, filed on Mar. 24, 2015, now Pat. No. 10,008,653.

(60) Provisional application No. 62/380,807, filed on Aug. 29, 2016, provisional application No. 61/969,344, filed on Mar. 24, 2014.

(51) Int. Cl.
  *H01L 35/20* (2006.01)
  *C22C 33/02* (2006.01)
  *H01L 35/18* (2006.01)
  *H01L 35/34* (2006.01)
  *C22C 1/04* (2006.01)
  *C22C 12/00* (2006.01)
  *C22C 38/00* (2006.01)

(52) U.S. Cl.
  CPC .......... *H01L 35/20* (2013.01); *C22C 1/04* (2013.01); *C22C 12/00* (2013.01); *H01L 35/18* (2013.01); *H01L 35/34* (2013.01); *B22F 2998/10* (2013.01); *C22C 1/045* (2013.01); *C22C 33/0278* (2013.01); *C22C 38/00* (2013.01)

(58) Field of Classification Search
  CPC ......... H01L 35/26; H01L 35/16; H01L 35/22; H01L 35/34; B22F 3/14; B22F 3/24; C22C 1/04; C22C 1/0483; C22C 13/00
  USPC ..................... 252/62.3 T; 136/200
  See application file for complete search history.

(56) References Cited

U.S. PATENT DOCUMENTS

2012/0326097 A1* 12/2012 Ren .................. H01L 35/18
                                                    252/513

OTHER PUBLICATIONS

Young et al., Thermoelectric properties of pure and doped FeMSb (M=V,Nb), Journal of Applied Physics, American Institute of Physics, vol./issue 87, pp. 317-321 (Year: 2000).*

* cited by examiner

Primary Examiner — Jayne L Mershon
(74) Attorney, Agent, or Firm — Conley Rose, P.C.

(57) ABSTRACT

Discussed herein are half-Heusler thermoelectric materials including niobium, iron, antimony, and titanium that are formed by ball-milling and hot-pressing the ball-milled power to obtain various thermoelectric properties and an average grain size above 1 μm.

20 Claims, 24 Drawing Sheets

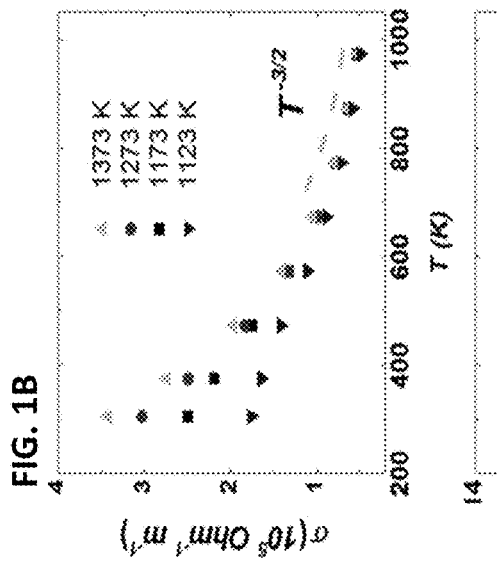
FIG. 1A
FIG. 1B
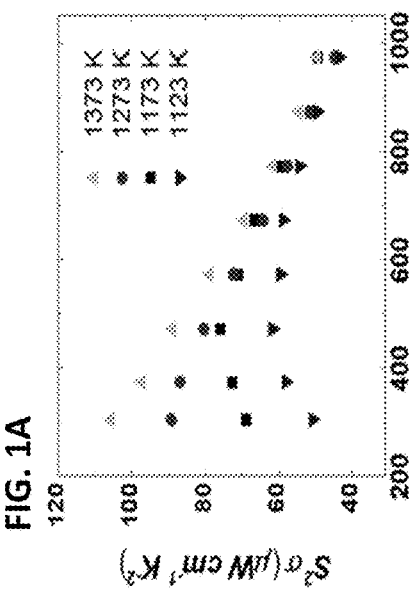
FIG. 1C
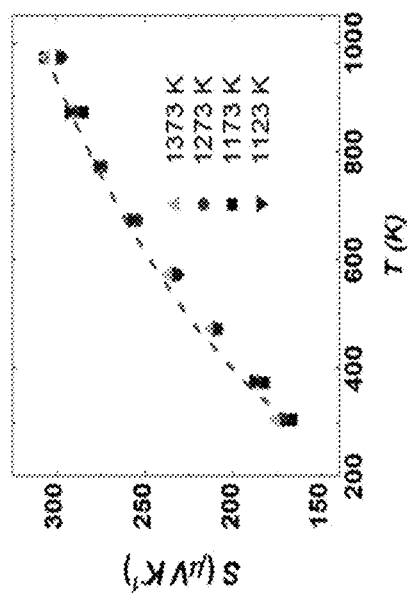
FIG. 1D

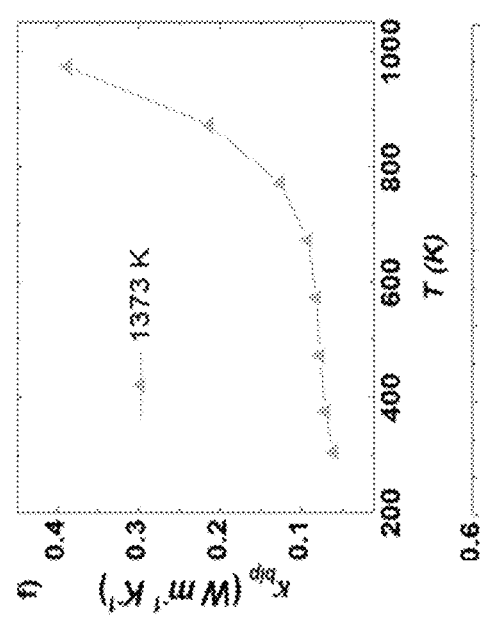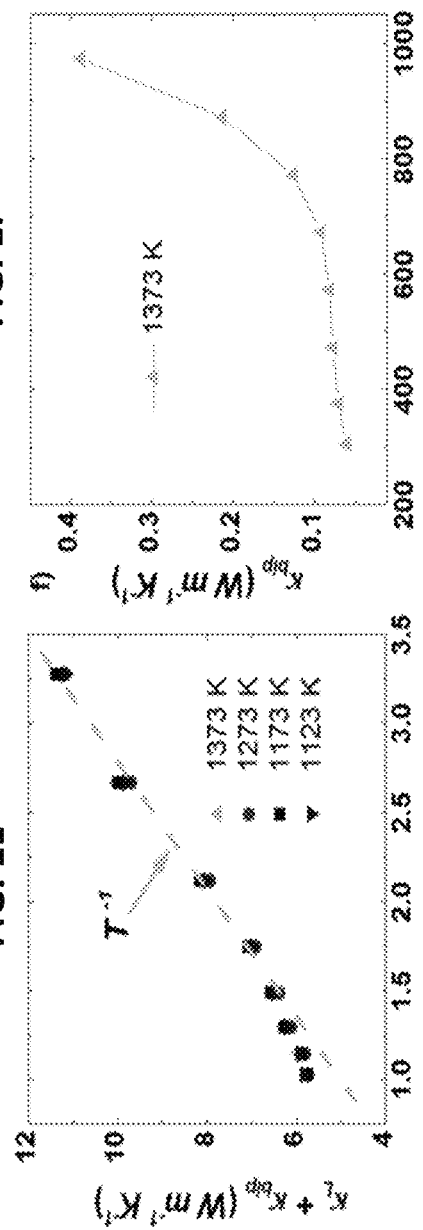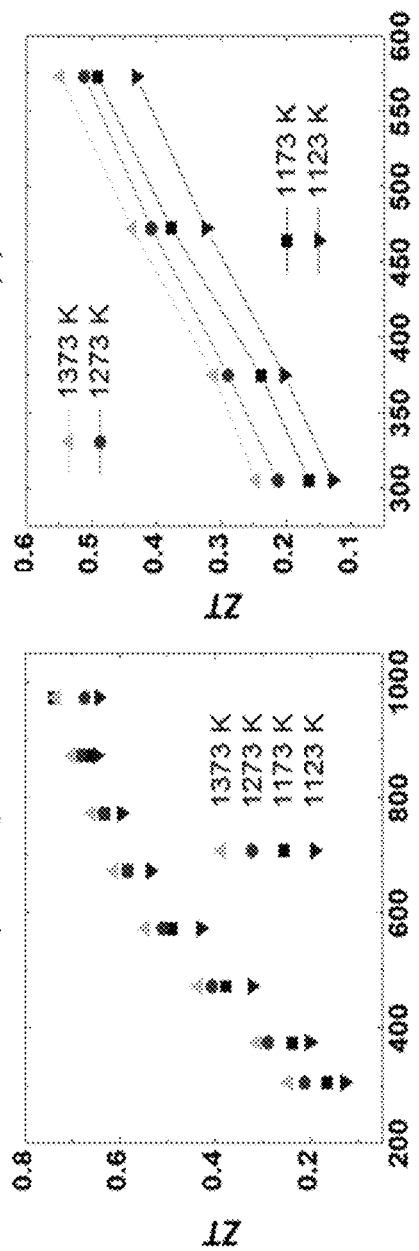
FIG. 1F
FIG. 1E
FIG. 1G
FIG. 1H

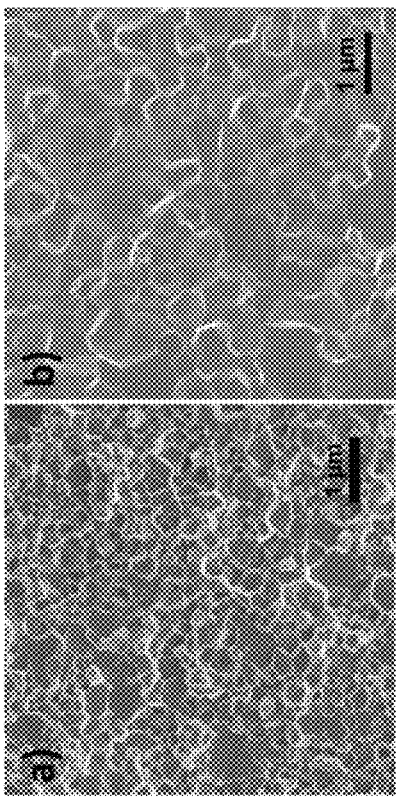

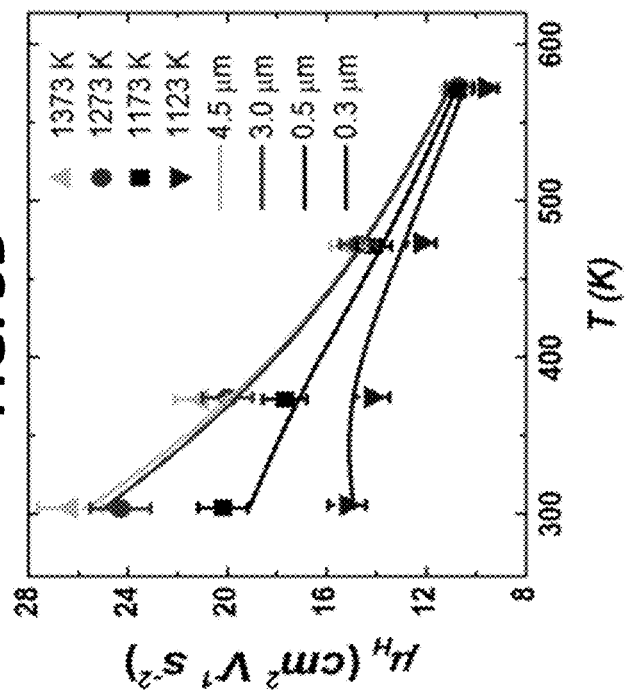
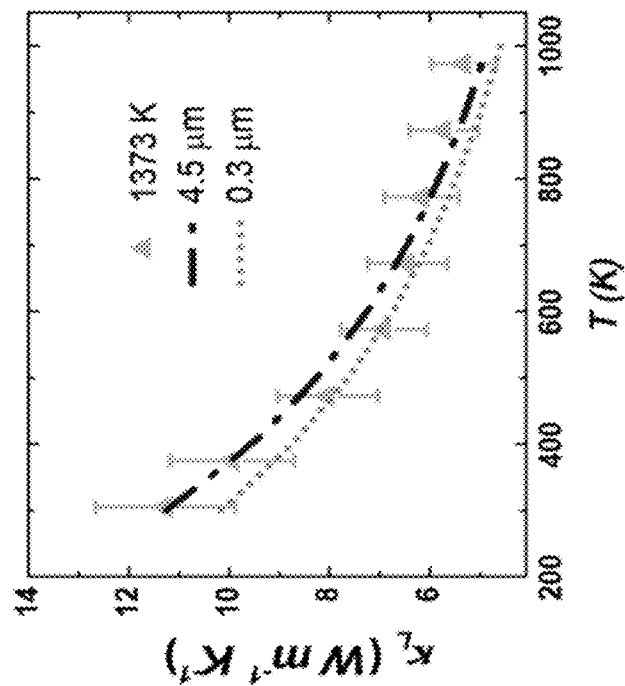
FIG. 3A
FIG. 3B

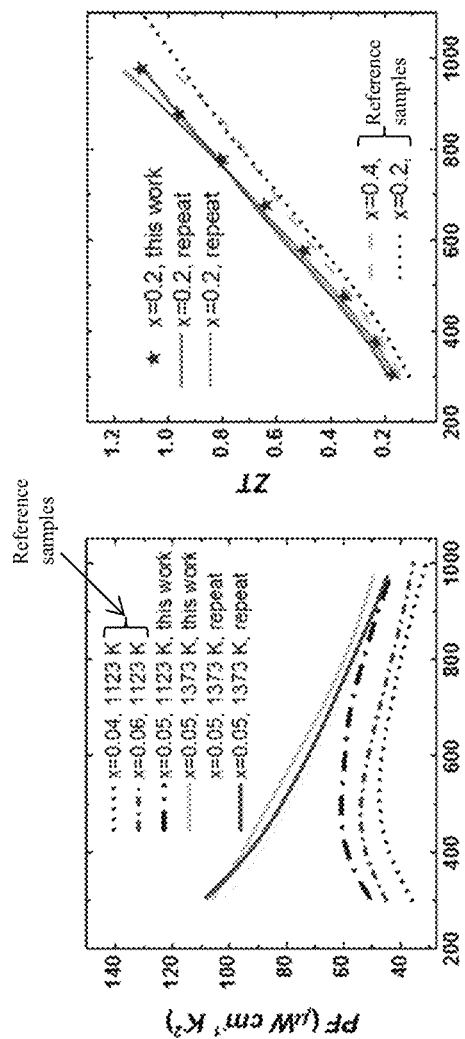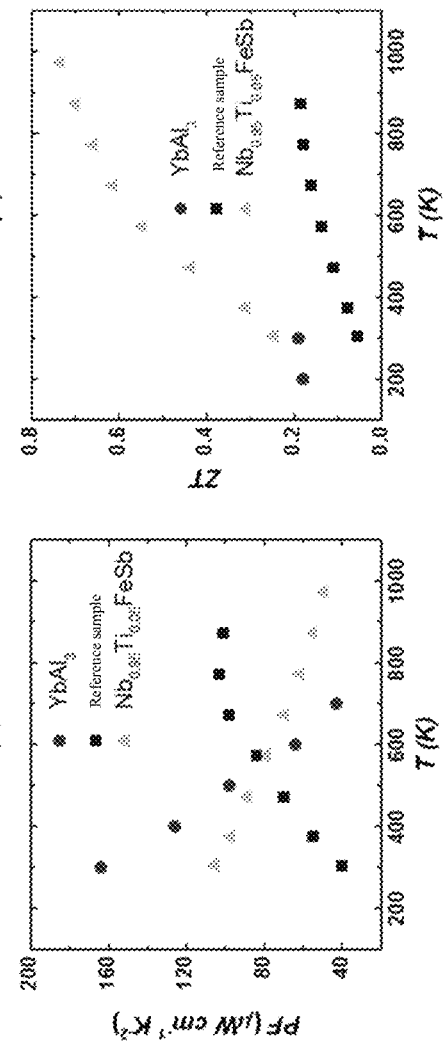
FIG. 5A FIG. 5B FIG. 5C FIG. 5D

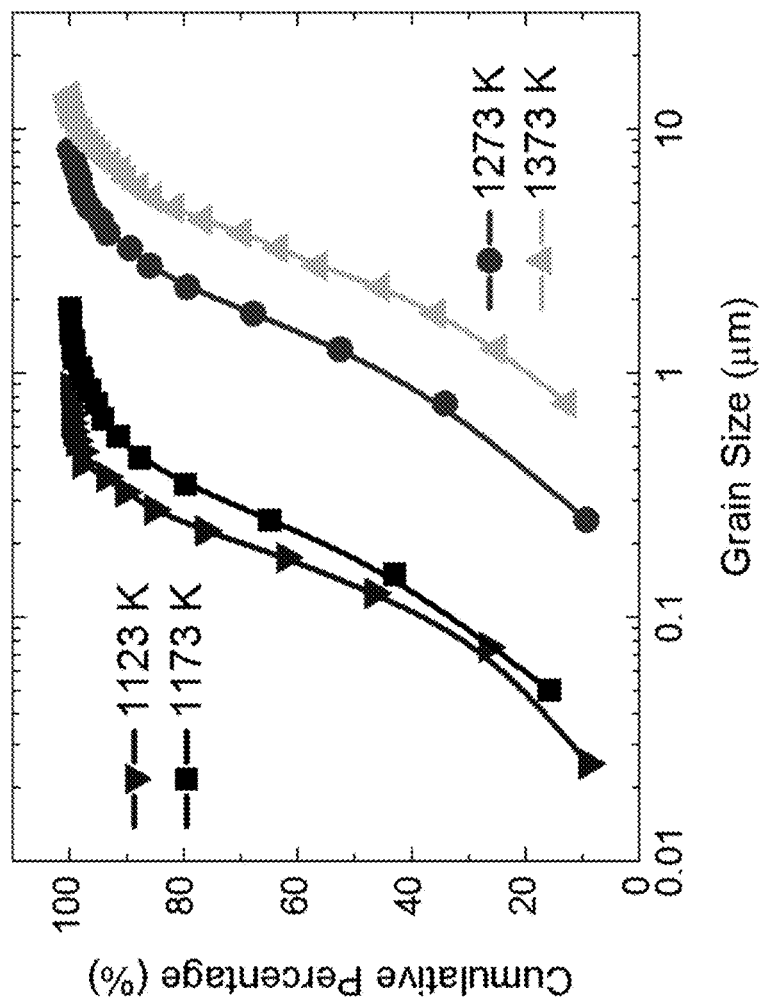

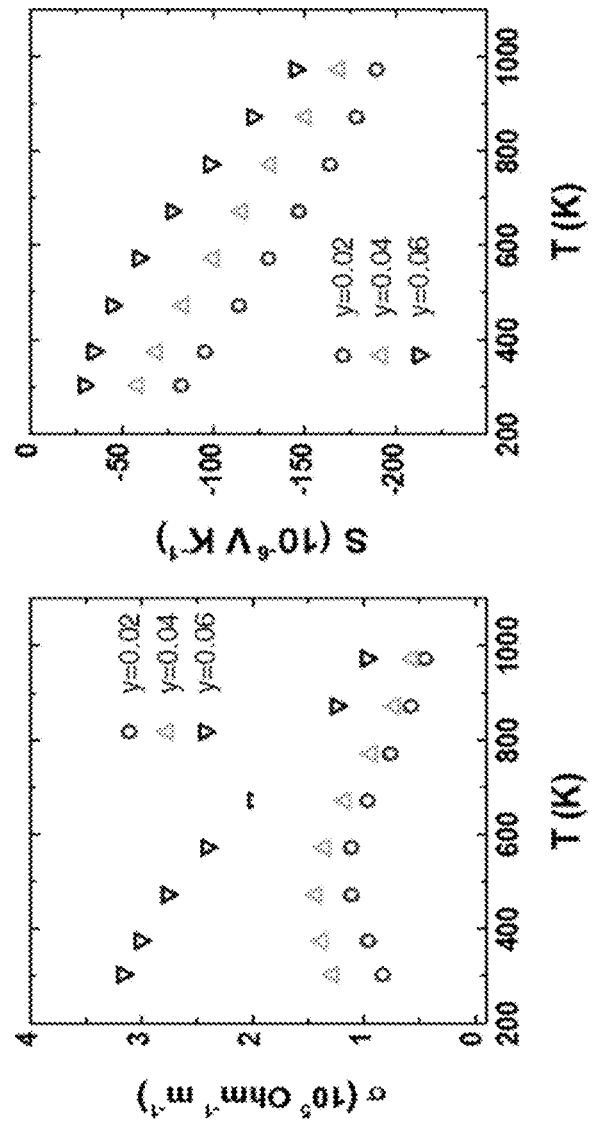

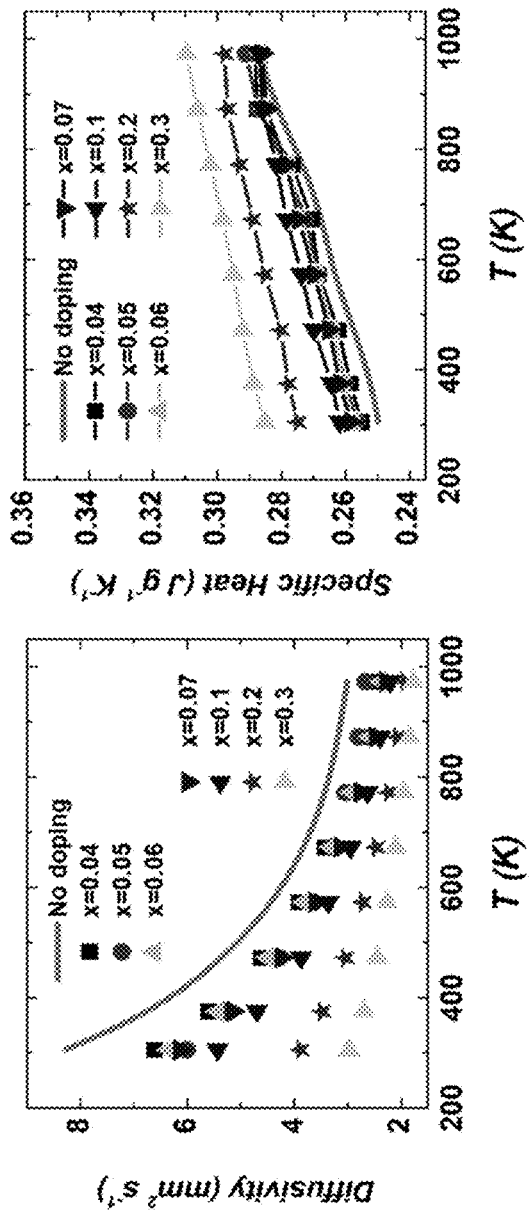

SYSTEMS AND METHODS OF FABRICATION AND USE OF NBFESB P-TYPE HALF-HEUSLER THERMOELECTRIC MATERIALS

CROSS-REFERENCE TO RELATED APPLICATIONS

This application claims priority to U.S. Provisional Application No. 62/380,807, "Systems and Methods of Fabrication and Use of NbFeSb P-Type Half-Heusler Thermoelectric Materials," filed Aug. 29, 2016 and incorporated in its entirety herein by this reference; and claims priority to and is a continuation-in-part of U.S. application Ser. No. 14/667,056, "NbFeSb-Based Half-Heusler Thermoelectric Materials and Methods of Fabrication and Use," filed Mar. 24, 2015 which claims priority to U.S. Provisional Application No. 61/969,344, filed Mar. 24, 2014, both of which are incorporated by reference in their entirety herein

STATEMENT REGARDING FEDERALLY SPONSORED RESEARCH OR DEVELOPMENT

This work is funded in part by U.S. Department of Energy under contract number DE-SC0010831 and by the Solid State Solar Thermal Energy Conversion Center (S3TEC) under contract number DE-SC0001299.

BACKGROUND

Half-Heuslers (HHs) are intermetallic compounds which have great potential as high temperature thermoelectric materials for power generation. However, the dimensionless thermoelectric figure-of-merit (ZT) of HHs is lower than that of the most state-of-the-art thermoelectric materials. HHs are complex compounds, including MCoSb (p-type) and MNiSn (n-type), where M can be Ti or Zr or Hf or combination of two or three of the elements. They form in cubic crystal structure with a F4/3 m (No. 216) space group. These phases are semiconductors with 18 valence electron count (VEC) per unit cell and a narrow energy gap. The Fermi level is slightly above the top of the valence band. The HH phases have a useful Seebeck coefficient with moderate electrical conductivity. The performance of thermoelectric materials depends on ZT, defined by $ZT=(S^2\sigma/\kappa)T$, where $\sigma$ is the electrical conductivity, S the Seebeck coefficient, $\kappa$ the thermal conductivity, and T the absolute temperature. Half-Heusler compounds may be good thermoelectric materials due to their high power factor ($S^2\sigma$). It has been reported that the MNiSn phases are promising n-type thermoelectric materials with exceptionally large power factors and MCoSb phases are promising p-type materials. In recent years, different approaches have been reported that have improved the ZT of half-Heusler compounds.

BRIEF SUMMARY OF THE DISCLOSURE

Embodiments described herein comprise a combination of features and characteristics intended to address various shortcomings associated with certain prior devices, compositions, systems, and methods. The various features and characteristics described above, as well as others, will be readily apparent to those of ordinary skill in the art upon reading the following detailed description, and by referring to the accompanying drawings.

In an embodiment, a method of fabricating a thermoelectric component, comprising: forming, an ingot of a first alloy comprising niobium, iron, antimony, and titanium according to a formula $Nb_{1-x}Ti_xFeSb$; ball-milling the ingot to form a ball-milled powder; hot-pressing the ball-milled powder between 1100 K and 1400 K to form a thermoelectric component comprising a power factor above about 60 $\mu W$ $cm^{-1}$ $K^{-2}$ from about 300K to about 775K.

In an embodiment, a thermoelectric device comprising: a hot-pressed component of ball-milled powder according to a formula $Nb_{1-x}Ti_xFeSb$, wherein the component comprises a power factor above about 60 $\mu W$ $cm^{-1}$ $K^{-2}$ from about 300 K to about 775 K and an average grain size above 1 $\mu m$.

In an embodiment, a thermoelectric device comprising: a hot-pressed component of ball-milled powder according to a formula $Nb_{1-x}Ti_xFeSb$, wherein a power factor above about 60 $\mu W$ $cm^{-1}$ $K^{-2}$ from about 300K to about 775K, and wherein x is from 0.02 to 0.7.

BRIEF DESCRIPTION OF THE DRAWINGS

FIGS. 1A-1H show the thermoelectric properties of $Nb_{0.95}Ti_{0.05}FeSb$ fabricated according to certain embodiments of the present disclosure.

FIGS. 2A-2D are scanning electron microscopy (SEM) images that show significant enlargement of the grain sizes of thermoelectric materials at increasing hot-pressing temperatures for samples fabricated according to certain embodiments of the present disclosure.

FIGS. 3A and 3B are graphs illustrating the effect of grain size on (FIG. 3A) lattice thermal conductivity and (FIG. 3B) hole mobility for samples fabricated according to certain embodiments of the present disclosure.

FIGS. 5A-5D show a TE property comparison for $Nb_{0.95}Ti_{0.05}FeSb$, fabricated according to certain embodiments of the present disclosure, as compared to reference sample data.

FIG. 11A is a cumulative grain size distribution of $Nb_{0.95}Ti_{0.05}FeSb$ pressed at 1123 K, 1173 K, 1273 K and 1373 K according to certain embodiments of the present disclosure.

FIGS. 17A-17E are graphs of thermoelectric properties of n-type $NbFe_{1-y}Co_ySb$ fabricated according to certain embodiments of the present disclosure.

FIGS. 18A and 18B illustrate the temperature dependency of thermoelectric materials fabricated according to certain embodiments of the present disclosure.

DETAILED DESCRIPTION OF EXEMPLARY EMBODIMENTS

Figure 4A:
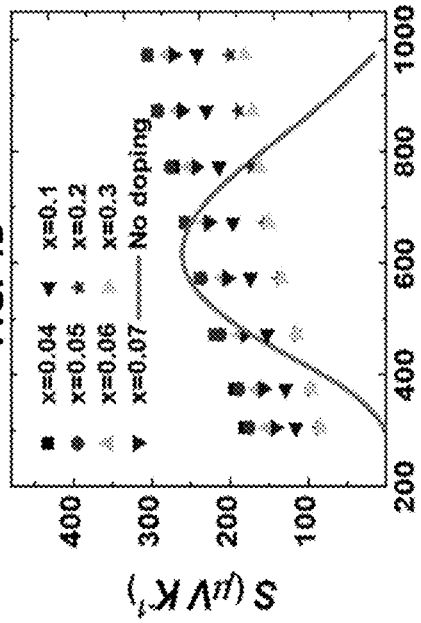
FIGS. 4A-F illustrate the thermoelectric property dependence of temperature for $Nb_{1-x}Ti_xFeSb$ with x=0, 0.04, 0.05, 0.06, 0.07, 0.1, 0.2, and 0.3 for samples fabricated according to certain embodiments of the present disclosure.

The following discussion is directed to various exemplary embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ."

"Achieving High Power Factor and Output Power Density in p-type half-Heuslers Nb1-xTixFeSb," Proceedings of the National Academy of Sciences of the United States of America, vol. 133, no. 48 (October 2016), is incorporated by reference in its entirety herein.

It is estimated by some that about 20 to 50% of industrial energy input is lost as waste heat. By converting some of the waste heat into useful electrical power, the consumption of fossil fuels could be significantly reduced, which slows down the increase of the atmospheric carbon dioxide that is a major concern for the environment. Thermoelectric (TE) materials are considered unique in converting heat into electricity. The conversion efficiency by TE materials is usually characterized by, $$\eta = \frac{T_H - T_C}{T_H} \cdot \frac{\sqrt{1+\overline{ZT}} - 1}{\sqrt{1+\overline{ZT}} + \frac{T_C}{T_H}} \quad (1)$$

where $\overline{ZT}$ is the average thermoelectric figure of merit (ZT) between the hot side temperature ($T_H$) and cold side temperature ($T_C$) of a TE material, and is defined as:

$$ZT = \frac{PF}{\kappa_{tot}}T \quad (2)$$

$$PF = S^2\sigma \quad (3)$$

$$\kappa_{tot} = \kappa_L + \kappa_e + \kappa_{bip} \quad (4)$$

where PF, T, $\kappa_{tot}$, S, $\sigma$, $\kappa_L$, $\kappa_e$, and $\kappa_{iv}$, are the power factor, absolute temperature, total thermal conductivity, Seebeck coefficient, electrical conductivity, lattice thermal conductivity, electronic thermal conductivity, and bipolar thermal conductivity, respectively. Higher ZT corresponds to higher conversion efficiency.

However, this conversion approach sometimes harms the electron transport due to too much scattering of the carriers, which reduces electrical conductivity and the power factor. The output power density w may be determined by power factor.

$$\omega = \frac{(T_H - T_C)^2}{4L}\overline{PF} \quad (5)$$

where L is the leg length of TE material. Even though leg length can be shortened, it is not without limit due to stress, parasitic loss from contacts, mechanical reliability, etc. Therefore, higher power factor is desirable for higher output power density.

Half-Heusler (HH) compound is crystallized in the space group F$\overline{4}$3m. Among the various compounds, ZrNiSn based n-type and ZrCoSb based p-type materials are widely studied due to their presently acceptable ZT ~1 at 873 to 1073 K[26-28], low cost, high power density, excellent mechanical properties, and non-toxicity.

HH possesses high power factors, which is desirable for power generation. As discussed herein, an $Nb_{1-x}Ti_xFeSb$ system was evaluated with x=0.04, 0.05, 0.06, 0.07, 0.1, 0.2, and 0.3 using arc melting, ball milling and hot-pressing (HP) at 1123, 1173, 1273, and 1373 K. It turns out higher HP temperature enhances the carrier mobility, leading to a record PF of ~106 µW cm$^{-1}$ K$^{-2}$ at 300 K in $Nb_{0.95}Ti_{0.05}FeSb$. The high PF in the resulting compounds may stem from the increased carrier mobility. With such a high PF, a record output power density of about 22 W cm$^{-2}$ with a leg length of about 2 mm is experimentally achieved with $T_C$=293 K and $T_H$=868 K. On the other hand, the thermal conductivity is almost unchanged regardless of the grain sizes. Thus, by using higher HP temperature of 1373 K and changing the Ti concentration, higher mobility, PF, and ZT than the reported results for the same compositions were achieved.

Example Experimental Procedure

Sample Preparation:

In one example, 15 grams of raw elements (Nb pieces, 99.9% and Sb broken rods, 99.9%, Atlantic Metals & Alloy;

Fe granules, 99.98% and Ti foams, 99.9%, Alfa Aesar) were weighed under an argon environment inside a glove box according to stoichiometry. The elements were arc melted to first form an ingot. To enhance the ingot's uniformity, the ingots were melted 3-4 times and flipped over each time. To get nano powders, the ingot were ball milled (SPEX 8000M Mixer/Mill) for 3 hours under Ar protection by two stainless steel balls with diameter of 12.7 mm. In alternate embodiments, the ball-milling may occur from 10 minutes to 70 hours, and may occur in one or more cycles. The powders were then consolidated into disks by hot pressing at 80 MPa and 2 minutes at 1123, 1173, 1273, and 1373 K with a temperature rising rate of ~100 K/min.

Sample Characterization.

A PANalytical multipurpose diffractometer with an X'celerator detector (PANalytical X'Pert Pro) was used to characterize the phases. Morphology and elemental ratios of the samples were characterized by scanning electron microscopy (SEM, LEO 1525) and Electron Probe Micro-Analysis (EPMA, JXA-8600), respectively. Transmission electron microscopy (TEM, JEOL 2100F) was used to observe the detailed microstructures.

Property Measurement.

The thermal conductivity was calculated as a product of the thermal diffusivities, specific heat, and density, which were measured by a laserflash machine (LFA457, Netzsch), a differential scanning calorimeter (DSC 404 C, Netzsch), and an Archimedes' kit, respectively. Samples in bar shape with sizes around 2 mm×2 mm×10 mm were used for measuring the electrical conductivity and the Seebeck coefficient in a ZEM-3 (ULVAC) machine. Hall concentrations ($n_H$) were measured using a physical properties measurement system (PPMS, Quantum Design) under ±3 Tesla magnetic induction. The Hall mobility $\mu_H$ was calculated using $\mu_H=\sigma/(n_H q)$. The uncertainty for electrical conductivity is 3%, Seebeck coefficient 5%, thermal conductivity 7% (comprising uncertainties of 4% for thermal diffusivity, 5% for specific heat, and 3% for density), so the combined uncertainty for power factor and ZT are 10% and 12%, respectively. To increase the readability, no error bars are present on the curves.

Results and Discussion

Enhanced Power Factor with Higher Hot Pressing Temperature

FIGS. 1A-1H show the thermoelectric properties of $Nb_{0.95}Ti_{0.05}FeSb$ with hot pressing temperatures at 1123, 1173, 1273, and 1373 K. In particular, FIG. 1A shows the power factor, FIG. 1B shows the electrical conductivity (a), FIG. 1C shows the Seebeck coefficient (S), FIG. 1D shows the total thermal conductivity ($\kappa_{tot}$), FIG. 1E shows the lattice and bipolar thermal conductivity ($\kappa_L + \kappa_{bip}$), FIG. 1F shows the bipolar thermal conductivity ($\kappa_{bip}$), FIG. 1G shows the figure of merit (ZT) from 200 to 1000K, and FIG. 1H shows ZT with T from 300 to 573 K. As discussed herein, the power factor may be expressed as "PF" or as "$S^2\sigma$." The dashed lines in FIGS. 1B and 1E represents the $T^{-3/2}$ and $T^{-1}$ relation, respectively. The dashed line in FIG. 1C shows the calculated Seebeck coefficient using the SPB model.

FIG. 1A shows a power factor (PF) above at below 1000 K with an increasing hot pressing temperature. The peak value reaches ~106 µW cm$^{-1}$ K$^{-2}$ at room temperature, for the sample hot-pressed at about 1373 K.

FIG. 1B shows that the high power factor may be at least in part due to the improved electrical conductivity. As shown in FIG. 1B, the electrical conductivity (σ) is above 1.5 10$^5$ Ohm$^{-1}$m$^{-1}$ at hot-pressing temperatures from 1123 K to 1373 K. Above 673 K, the electrical conductivity converges and follows the $T^{-3/2}$ law, showing the acoustic phonons dominate carrier scattering.

Figure 8:
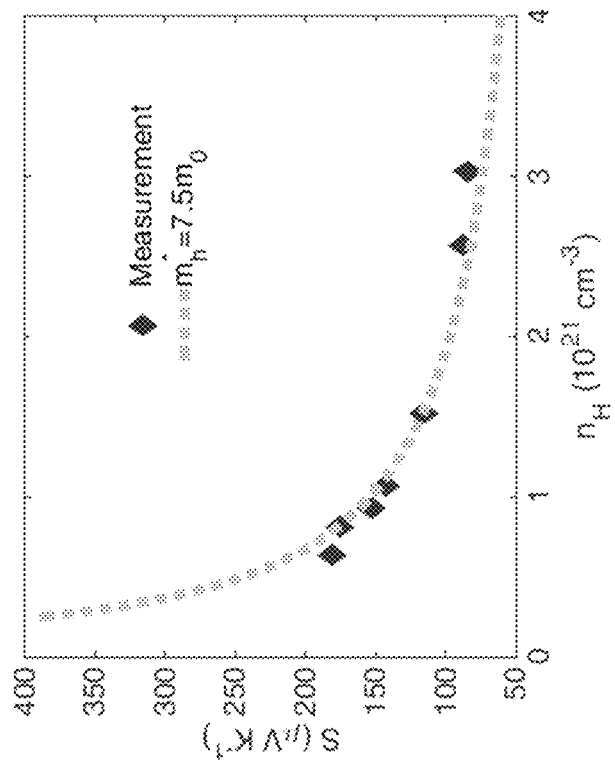
FIG. 8 is a Pisarenko plot of thermoelectric materials fabricated according to certain embodiments of the present disclosure.

The Seebeck coefficient in FIG. 1C is illustrated via a dashed line which is the calculated Seebeck coefficient. FIG. 1C uses the single parabolic band (SPB) model (taking the scattering parameter r=−0.5 since acoustic phonon scattering dominates), $$|S| = \left(\frac{k_B}{e}\right)\left[\frac{2F_1(\eta)}{F_0(\eta)} - \eta\right] \quad (6)$$

$$F_n(\eta) = \int_0^\infty \frac{\chi^n}{1+e^{\chi-\eta}}d\chi \quad (7)$$

where η is related with $n_H$ through $$n_H = 4\pi\left(\frac{2m_h^* k_B T}{h^2}\right)^{3/2}\frac{F_{1/2}(\eta)}{r_H} \quad (8)$$

$$r_H = \frac{3}{2}\frac{F_{-1/2}(\eta)F_{1/2}(\eta)}{2F_0^2(\eta)} \quad (9)$$

where η, $n_H$, $m^*_h$, and $r_H$ are the reduced Fermi energy, the Hall carrier concentration, density of states (DOS) effective mass of holes, and the Hall factor, respectively. $n_H$ is obtained through Hall measurement (Table 1) and $m^*_h$ is obtained by fitting the Pisarenko relation in FIG. 8. $F_n(\eta)$ is the Fermi integral of order n. The good agreement between the calculated and experimental values shows the adequacy of SPB model in describing the hole transport. In FIG. 8, the Pisarenko relationship is shown with DOS effective mass $m^*_h=7.5$ $m_0$ for holes, showing the validation of SPB model.

Meanwhile, the thermal conductivity shown in FIG. 1D is a little bit lower for samples hot pressed at the lower hot pressing temperatures, which, however, is mainly due to the difference in the electronic thermal conductivity as a result of the electrical conductivity $$\kappa_e = L\sigma T \quad (10)$$

$$L = \left(\frac{k_B}{e}\right)^2\left[\frac{3F_2(\eta)}{F_0(\eta)} - \left(\frac{2F_1(\eta)}{F_0(\eta)}\right)^2\right] \quad (11)$$

where L is the Lorenz number. $\kappa_L + \kappa_{bip}$ are plotted in FIG. 1e by subtracting the $\kappa_e$ from $\kappa_{tot}$. It shows the lattice thermal conductivity is barely affected by the hot pressing temperature. In addition, at above 773 K there occurs slightly deviation from the $T^{-1}$ curve, showing some minor bipolar effect even though the Seebeck coefficient seems to not show such an effect. The $\kappa_{bip}$ are calculated in FIG. 1F using a three-band model. The highest value reaches ~0.4 W m$^{-1}$ K$^{-1}$ at 973 K, a small value comparing to the $\kappa_L$.

As a result, the enhanced power factor and almost fixed thermal conductivity led to higher ZT values, especially at temperatures below 573 K (FIGS. 1G and 1H) where the power factor shows larger differences (FIG. 1A).

FIGS. 2A-2D are scanning electron microscopy (SEM) images that show significant enlargement of the grain sizes with increasing hot-pressing temperatures. Statistically (see FIGS. 9, 10A-10D, and 11) the average grains sizes are found to be ~0.3, ~0.5, ~3.0, and ~4.5 µm for samples pressed at 1123 K (FIG. 2A), 1173 K (FIG. 2B), 1273 K (FIG. 2C), and 1373 K (FIG. 2D), respectively. In various embodiments, the average grain size may be larger than 1.0 μm, for example, up to 10 μm. As discussed herein, the average grain size may refer to an average of the maximum dimensions of each grain.

Table 1 (below) shows the room temperature Hall carrier concentration ($n_H$), Hall mobility ($\rho_H$), Hall factor ($r_H$), deformation potential ($E_{def}$), and relative density of $Nb_{1-x}Ti_xFeSb$ for different hot pressing temperatures. The room temperature (RT) Hall measurement shows a ~73% enhancement of Hall mobility ($\mu_H$) of samples pressed at 1373 K over 1123 K. Since the lattice thermal conductivity (FIG. 1E) changes little with the grain sizes, it is very interesting to investigate why the enlarged grain size performs so differently to the electron transport.

TABLE 1

| | $n_H$ ($10^{20}$ cm$^{-3}$) | $\mu_H$ (cm$^2$ V$^{-1}$ s$^{-1}$) | $r_H$ | $E_{def}$ (eV) | relative density (%) |
|---|---|---|---|---|---|
| x = 0.04, 1373 K | 6.3 | 25.2 | 1.12 | 12.5 | 99.1 |
| x = 0.05, 1123 K | 7.2 | 15.2 | 1.12 | —* | 99.4 |
| x = 0.05, 1173 K | 7.7 | 20.2 | 1.12 | —* | 98.9 |
| x = 0.05, 1273 K | 7.7 | 24.3 | 1.12 | 11.8 | 98.6 |
| x = 0.05, 1373 K | 8.1 | 26.3 | 1.12 | 11.5 | 99.0 |
| x = 0.06, 1373 K | 9.3 | 27.3 | 1.11 | 11.6 | 99.3 |
| x = 0.07, 1373 K | 10.7 | 26.7 | 1.10 | 11.6 | 98.9 |
| x = 0.10, 1373 K | 15.2 | 24.0 | 1.08 | 12.7 | 99.3 |
| x = 0.20, 1373 K | 25.7 | 15.2 | 1.06 | 13.7 | 99.1 |
| x = 0.30, 1373 K | 30.3 | 9.3 | 1.06 | 17.6 | 98.9 |

*Data are not given since the mobility are strongly affected by grain boundary scattering Effect of Grain Size on Lattice Thermal Conductivity and Carrier Mobility The lattice thermal conductivity ($\kappa_L$) of samples pressed at 1373 K is obtained by subtracting $\kappa_e$ and $\kappa_{bip}$ (FIG. 1F) from $\kappa_{tot}$. For analyzing, Debye-Callaway model was used and the phonon scattering was split into 4 different sources: Three phonon process (3P), grain boundary (GB), point defects (PD), and electron-phonon interaction (EP). The complete results combining 3P, GB, PD, and EP are discussed below.

Table 2 lists parameters in Debye-Callaway model for $Nb_{1-x}Ti_xFeSb$.

| | PD | | 3P | | EP | v |
|---|---|---|---|---|---|---|
| x | $\Gamma(10^{-3})$ | $\varepsilon$ | B ($10^{11}$ s$^{-1}$) | $\gamma_1$ | C × $n_H^{-4/3}$ (m$^4$ s$^{-1}$) | (m s$^{-1}$) |
| 0 | 0 | 80 | 8.06 | 0.69 | 3.86 × 10$^{-25}$ | 3879 |
| 0.04 | 4.5 | | 8.16 | | | 3871 |
| 0.05 | 5.6 | | 8.19 | | | 3869 |
| 0.06 | 6.6 | | 8.22 | | | 3867 |
| 0.07 | 7.6 | | 8.24 | | | 3865 |
| 0.1 | 10.6 | | 8.32 | | | 3859 |
| 0.2 | 19.0 | | 8.59 | | | 3838 |
| 0.3 | 25.4 | | 8.90 | | | 3818 |

Figure 6:
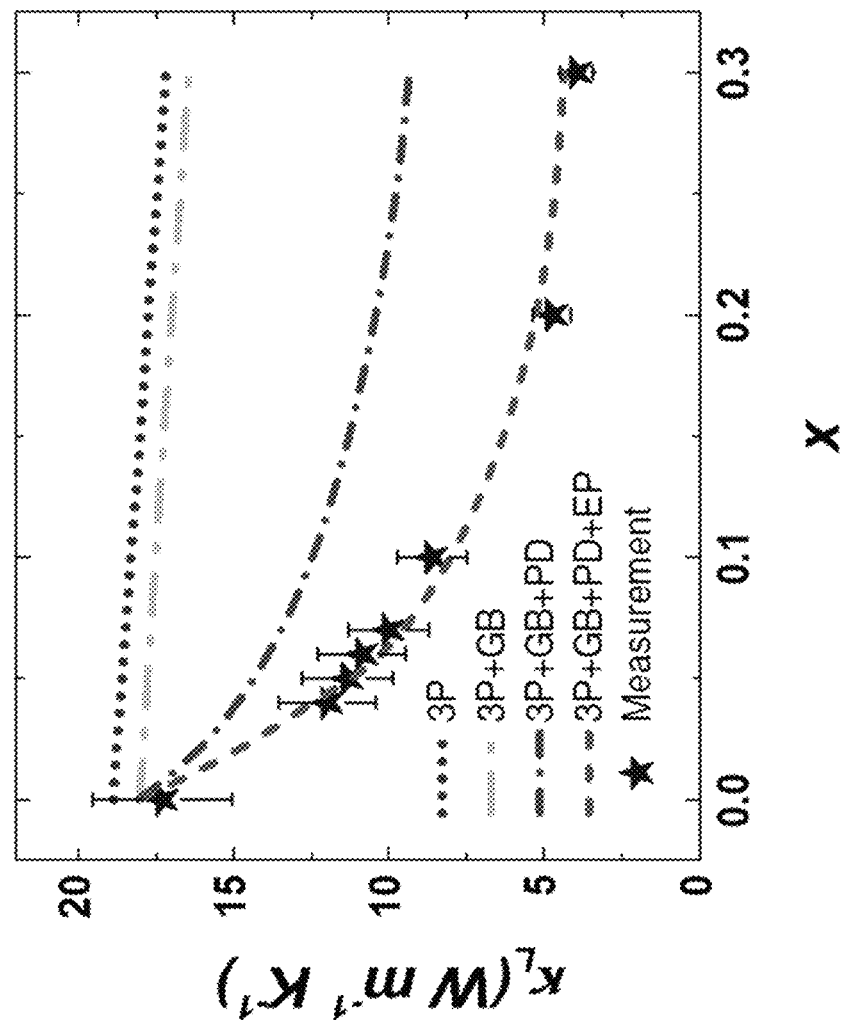
FIG. 6 illustrates the contribution of different phonon scattering mechanisms to the lattice thermal conductivity of $Nb_{1-x}Ti_xFeSb$ at room temperature for samples fabricated according to certain embodiments of the present disclosure.

FIGS. 3A and 3B are graphs illustrating the effect of grain size on (FIG. 3A) lattice thermal conductivity and (FIG. 3B) hole mobility ($n_H$). The symbols are measurement data and lines are calculated values. The effect of grain boundary scattering is shown in FIG. 6 and discussed below. The calculated lattice thermal conductivity decreases only ~9% with the grain size decreases by more than one order of magnitude (e.g., from 4.5 μm to 0.3 μm). Experimentally, $\kappa_L$ decreases consistently (~2%). The insensitivity of the phonon transport to the grain size may indicate that the phonon mean free path is much less than 0.3 μm. In the example in FIG. 3A, the For analyzing the mobility, firstly it was assumed a constant $n_H$ from room temperature through 1000 K, which is widely observed in half-Heulser systems, thus $\mu_H$ varies in the same trend as the conductivity ($\sigma$) through $$\sigma = q n_H \mu_H \quad (12)$$

At high temperatures, the dominant electron scattering is from the acoustic phonon (AP), $$\mu_{AP} = \frac{F_{-1/2}(\eta)}{2F_0(\eta)} \mu_0 \quad (13)$$

where, $$\mu_0 = \frac{e\pi\hbar^4}{\sqrt{2}(k_BT)^{3/2}} \frac{v_l^2 d}{E_{def}^2 (m_b^*)^{5/2}} \quad (14)$$

$$m_b^* = m_h^* \times (N_v)^{-2/3} \quad (15)$$

$v_l$ is the longitudinal phonon velocity, calculated according to the elastic constants[49], d is the density, $m^*_h$ is the density of states (DOS) effective mass for holes and $N_v$ is the valley degeneracy. $E_{def}$ is the deformation potential that is obtained by extrapolating the high temperature mobility back to room temperature using the $T^{-3/2}$ law. $E_{def}$ is found ~12 eV for $Nb_{0.95}Ti_{0.05}FeSb$, a relatively small value comparing with previously reported TE systems showing the weaker electron-phonon interaction in HH systems[44] and thus beneficial for the electron transport and the high power factor.

For the mobility at below 573 K, the grain boundary scattering was evaluated, $$\mu_{GB} = De\left(\frac{1}{2\pi m_b^* k_BT}\right)^{1/2} \exp\left(-\frac{E_B}{k_BT}\right) \quad (16)$$

where D is the grain size and $E_B$ is the barrier energy of grain boundary, which is set as a common fitting parameter for $Nb_{0.95}Ti_{0.05}FeSb$. Thus $\mu_H$ could be obtained through the Matthiessen's rule, $$\mu_H^{-1} = \mu_{AP}^{-1} + \mu_{GB}^{-1} \quad (17)$$

With $E_B$~0.1 eV, the fitting result (FIG. 3B), verified the effects of grain boundary scattering. In addition, it shows the grain boundary scattering become stronger when size is smaller: from 0.5 to 0.3 μm, the mobility decreases by ~30%, but from 4.5 to 3.0 μm, the mobility drops only 5%. When taken together, FIGS. 3A and 3B show the grain boundary may be more effective in electron scattering than phonon scattering.

It is noted that 1) for samples pressed at 1123 K through 1373 K, the lattice strain decreases much less (from 0.048% to 0.04%) (see FIG. 11B below)), 2) the change in carrier mobility is less than 80% (FIG. 3B) and could be attributed to the grain size variation, and 3) the $n_H$ changes only ~6% (Table 1), much less than the at least 100% caused by disorders.

TE Properties of p-Type $Nb_{1-x}Ti_xFeSb$

Figure 4B:
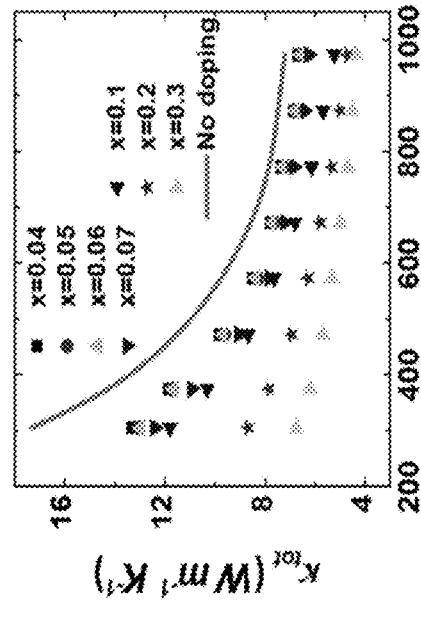
Figure 4C:
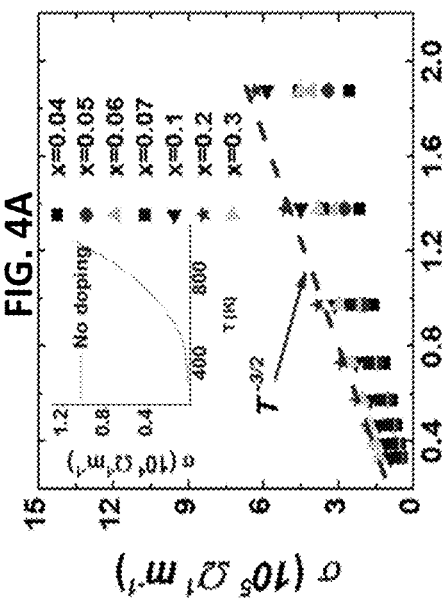
Figure 4D:
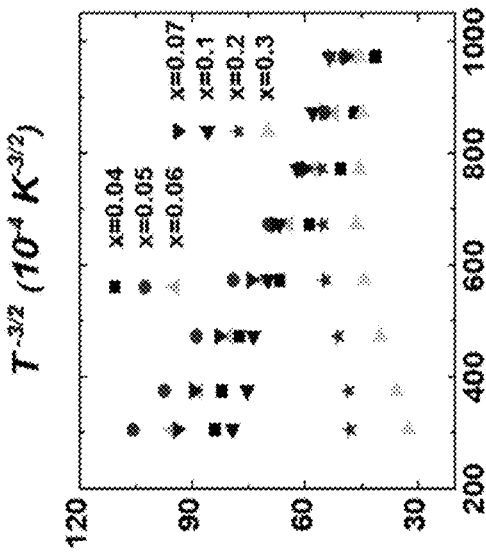
Figure 4F:
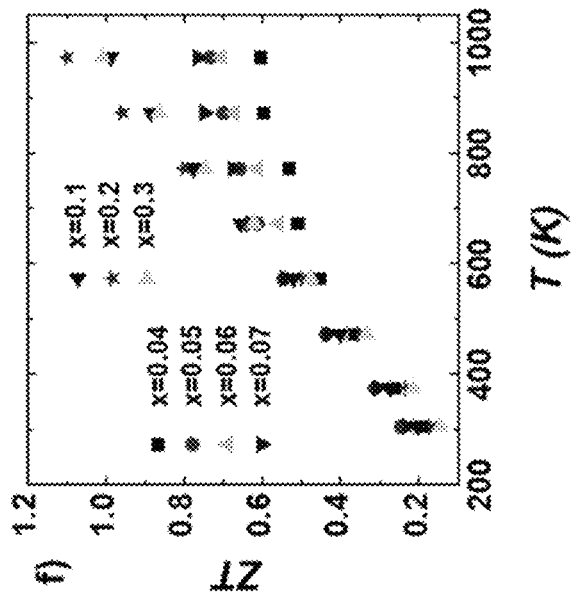
Figure 4E:
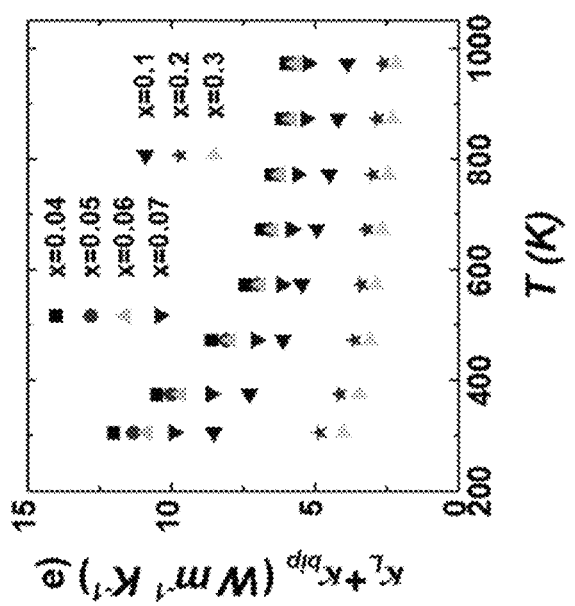

FIGS. 4A-F illustrate the thermoelectric property dependence of temperature for $Nb_{1-x}Ti_xFeSb$ with x=0, 0.04, 0.05, 0.06, 0.07, 0.1, 0.2, and 0.3 that were hot-pressed from about 1000° C. to about 1100° C. FIG. 4A shows the electrical conductivity, FIG. 4B shows the Seebeck coefficient, FIG. 4C shows the power factor, FIG. 4D shows the total thermal conductivity, FIG. 4E shows the lattice and bipolar thermal conductivity, and FIG. 4F shows the ZT. In FIG. 4A, the dashed line and the inset show the ~$T^{-3/2}$ relation and the conductivity of undoped NbFeSb, respectively. While discreet values of x such as x=0, 0.04, 0.05, 0.06, 0.07, 0.1, 0.2, and 0.3 are discussed herein, x may be up to 0.7 depending upon the embodiment.

The electrical conductivity ($\sigma$) (FIG. 4A) of undoped NbFeSb increases with temperature, showing typical semiconductor behaviors. The band gap could be estimated from the high temperature electrical conductivity using the following relation, $$\ln(\sigma) \propto E_g \times \frac{-1}{2k_BT} \quad (18)$$

The estimated value of the electrical conductivity is ~0.51 eV, very close to the DFT calculation (0.53 eV).

For the highly doped samples, $\sigma$ obeys the $T^{-3/2}$ law, showing the dominating acoustic phonon scattering. Meanwhile, $\sigma$ increases with x up to 0.2 because of the increased $n_H$; further increase x to 0.3, $\sigma$ decreased due to the decreased $\mu_H$ (Table 1). The Seebeck coefficient is lower with higher $n_H$ (FIG. 4B), showing a good agreement with the Pisarenko relation with a density of states (DOS) effective mass $m^*_h$=7.5 $m_0$ (FIG. 8).

$$S = \frac{8\pi k_B^2}{3eh^2} m_h^* T \left(\frac{\pi}{3n}\right)^{\frac{2}{3}} \quad (19)$$

The p-type $Nb_{1-x}Ti_xFeSb$ possesses both very high conductivity and Seebeck coefficient, leading to much higher power factor at a wide temperature range (~100 $\mu W\ cm^{-1}\ K^{-2}$ at RT and ~50 $\mu W\ cm^{-1}\ K^{-2}$ at 973 K in $Nb_{0.95}Ti_{0.05}FeSb$, $Nb_{0.94}Ti_{0.06}FeSb$, and $Nb_{0.93}Ti_{0.07}FeSb$ (FIG. 4C). These values are higher than previously reported values where 1123 K was used for sintering.

FIGS. 5A-5D show a TE property comparison, FIG. 5A shows the power factor;

FIG. 5B shows the ZT of the $Nb_{1-x}Ti_xFeSb$ systems from this work and previously reported data (reference samples); FIG. 5C illustrates the power factor of the $Nb_{1-x}Ti_xFeSb$ systems from this work and previously reported data (reference samples); and FIG. 5D illustrates the ZT among $Nb_{0.95}Ti_{0.05}FeSb$ fabricated according to embodiments of the present disclosure as compared to previously reported values of constantan and $YbAl_3$ with peak power factors exceeding 100 $\mu W\ cm^{-1}\ K^{-2}$ as shown in FIG. 5C. As shown in FIG. 5A, higher pressing temperature is associated with a higher PF.

Turning back to FIG. 4D, the total thermal conductivities ($\kappa_{tot}$) are shown. For an undoped sample, the value is ~17.3 W $m^{-1}\ K^{-1}$ at RT and 7.2 W $m^{-1}\ K^{-1}$ at 973 K. Ti doping effectively suppresses the thermal conductivity, especially the lattice part (FIG. 4E). As a result, the peak ZT reaches 1.1 for $Nb_{0.8}Ti_{0.2}FeSb$ (FIG. 4F) at 973 K. Higher values could be reasonably expected if the measurement goes to higher temperature, which, unfortunately, exceeds the limit of the employed measurement systems. These values are better than the previously reported values illustrated in FIG. 5B. In addition, for $Nb_{0.9}Ti_{0.1}FeSb$ and $Nb_{0.7}Ti_{0.3}FeSb$, the ZT value also reaches 1 at 973 K.

FIGS. 5C and 5D compare the power factor and ZT of a few materials with very high power factors previously reported for $YbAl_3$ single crystal, nanostructured $Nb_{0.95}Ti_{0.05}FeSb$ (according to an embodiment of the present disclosure) and constantan, all possess peak power factor of at least 100 $\mu W\ cm^{-1}\ K^{-2}$. Although the power factor in $Nb_{0.95}Ti_{0.05}FeSb$ is not the highest, the ZTs are much higher than the other two materials due to the relatively lower thermal conductivity. It is noted that the "repeat" indication on these figures indicates that the experiments were repeated for those values/compositions as indicated.

To analyze the room temperature lattice thermal conductivity, the Callaway model was used, incorporating different scattering mechanisms. The 3P, GB, PD, and EP processes are considered, as discussed herein, fitting parameters are listed in Table 3.

TABLE 3

Parameters in Klemens model for $Nb_{1-x}Ti_xFeSb$

| | PD | | 3P | | EP | v |
|---|---|---|---|---|---|---|
| x | $\Gamma(10^{-3})$ | $\varepsilon$ | B $(10^{11}\ s^{-1})$ | $\gamma_1$ | C × $n_H^{-4/3}$ $(m^4\ s^{-1})$ | $(m\ s^{-1})$ |
| 0 | 0 | 80 | 8.06 | 0.69 | 3.86 × $10^{-25}$ | 3879 |
| 0.04 | 4.5 | | 8.16 | | | 3871 |
| 0.05 | 5.6 | | 8.19 | | | 3869 |
| 0.06 | 6.6 | | 8.22 | | | 3867 |
| 0.07 | 7.6 | | 8.24 | | | 3865 |
| 0.1 | 10.6 | | 8.32 | | | 3859 |
| 0.2 | 19.0 | | 8.59 | | | 3838 |
| 0.3 | 25.4 | | 8.90 | | | 3818 |

FIG. 6 illustrates the contribution of different phonon scattering mechanisms to the lattice thermal conductivity of $Nb_{1-x}Ti_xFeSb$ at room temperature, these samples were formed via hot-pressing from about 1000° C. to about 1100° C. The indications of 3P, GB, PD, and EP represent three phonon process, grain boundary scattering, point defect scattering, and electron-phonon interaction, respectively. For grain boundary scattering, the grain size was set as 4.5 $\mu m$. The result is shown in FIG. 6. Indeed, the grain boundary scattering is much weaker comparing to the other scattering processes. Also notice the electron-phonon (EP) interaction in this system.

Power Output

Figures 7A, 7B:
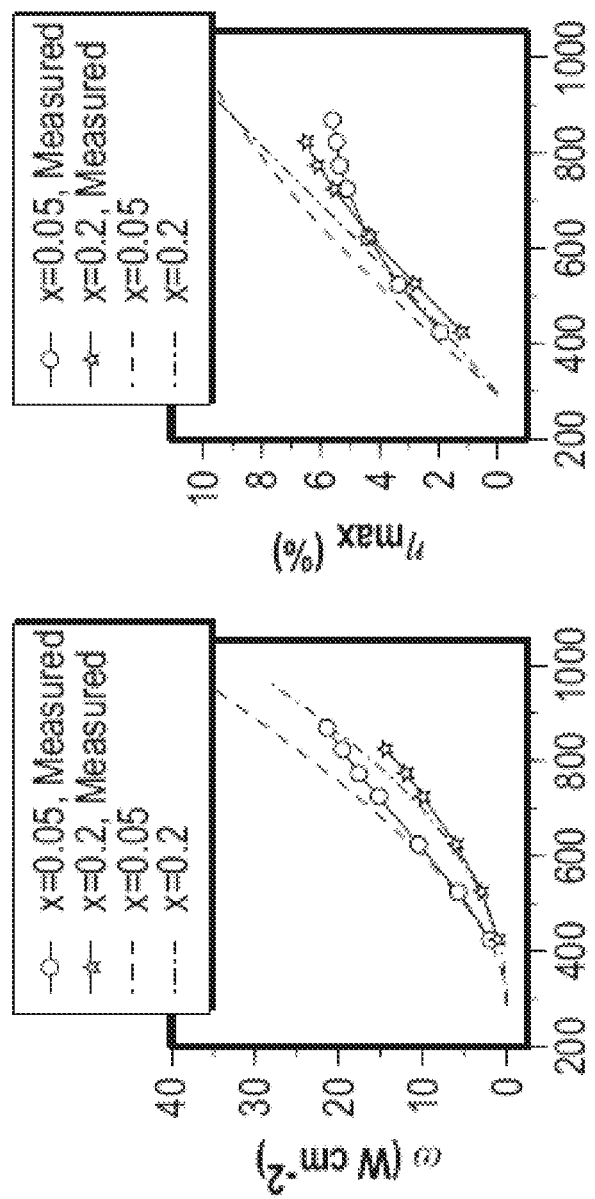
FIGS. 7A-7B show the calculated and measured (FIG. 7A) output power density and (FIG. 7B) conversion efficiency of samples $Nb_{1-x}Ti_xFeSb$ with x=0.05 and 0.2 for samples fabricated according to certain embodiments of the present disclosure.

Due to the higher power factor, higher power output is expected. FIGS. 7A and 7B show the calculated and measured output power density (FIG. 7A) and conversion efficiency of samples $Nb_{1-x}Ti_xFeSb$ with x=0.05 and 0.2 (FIG. 7B). The samples used for the measurements in FIGS. 7A and 7B were hot-pressed from about 1000° C. to about 1100° C. during formation.

The efficiency ($\eta_{max}$), and output power density ($\omega$) under a large temperature gradient accounting for the Thomson effect are calculated and are shown in FIGS. 7A and 7B. With $T_C$=293 K and leg length L=2 mm. the calculated $\omega$ and $\eta_{max}$ are, respectively, ~28 $Wcm^{-2}$ and 8.8% in $Nb_{0.95}Ti_{0.05}FeSb$ when $T_H$ is 868 K (FIG. 7A). FIG. 7A illustrates that the measured values for both x=0.05 and x=0.2 are above 10 W $cm^{-2}$ at above about 600 K.

It has to be considered that the output power density is inversely related to the leg length (equation (5)). By normalizing the leg length to 2 mm and comparing the values of power density among different reports (see Table 4), a high value for bulk thermoelectric materials was achieved which is desirable for power generation. It is noted that the power density numbers in parentheses are normalized to a leg length of 2 mm using equation (5).

TABLE 4

Comparison among several previously reported output power density of various TE systems.

| Measurement system | Materials (p-type/n-type) | L (mm) | $T_C/T_H$ (K) | ω of module (W cm$^{-2}$) | ω of materials (W cm$^{-2}$) | Previously Reported? |
|---|---|---|---|---|---|---|
| single leg | $Nb_{0.95}Ti_{0.05}FeSb$/— | 2 | 293/868 | — | 21.5 | no |
| single leg | $Nb_{0.8}Ti_{0.2}FeSb$/— | 2 | 293/823 | — | 14.6 | no |
| single leg | $MgAg_{0.965}Ni_{0.005}Sb_{0.99}$/— | 2 | 293/518 | — | 0.51 | yes |
| unicouple | $Nb_{0.6}Ti_{0.4}FeSb_{0.95}Sn_{0.05}$/ $Hf_{0.25}Zr_{0.75}NiSn_{0.99}Sb_{0.01}$ | 2 | 373/873 | — | 6.5 | yes |
| unicouple | $Hf_{0.44}Zr_{0.44}Ti_{0.12}CoSb_{0.8}Sn_{0.2}$/ $Hf_{0.25}Zr_{0.75}NiSn_{0.99}Sb_{0.01}$ | 2 | 373/873 | — | 5.5 | yes |
| Module | $Nb_{0.86}Hf_{0.14}FeSb$/ $Hf_{0.6}Zr_{0.4}NiSn_{0.98}Sb_{0.02}$ | 10 | 336/991 | 2.2 (11)* | — | yes |
| Module | $PbTe(MnTe)_{0.02}Na_{0.04}$/ $PbTe(PbI2)_{0.002}$ | 2.8 | 303/873 | 1.35 (1.89) | 5.62 (7.87) | yes |
| Module | $Mm_{0.30}Fe_{1.46}Co_{2.54}Sb_{12.05}$/ $Yb_{0.09}Ba_{0.05}La_{0.05}Co_4Sb_{12}$ | 4 | 313/733 | 0.46 (0.92) | 1.15 (2.3) | yes |
| Module | $La_{0.7}Ba_{0.1}Ga_{0.1}Ti_{0.1}Fe_3Co_1Sb_{12}$/ $Yb_{0.3}Ca_{0.1}Al_{0.1}Ga_{0.1}In_{0.1}Co_{3.75}Fe_{0.25}Sb_{12}$ | 7.6 | 323/873 | 1.28 (4.86) | — | yes |

Table 4 comprises data from electron probe micro-analysis (EPMA) measurements on various samples fabricated according to embodiments of the present disclosure.

| Nominal | EPMA |
|---|---|
| $Nb_{0.96}Ti_{0.04}FeSb$ | $Nb_{0.95}Ti_{0.04}Fe_{1.03}Sb_{0.98}$ |
| $Nb_{0.95}Ti_{0.05}FeSb$ | $Nb_{0.94}Ti_{0.06}Fe_{1.01}Sb_{0.99}$ |
| $Nb_{0.94}Ti_{0.06}FeSb$ | $Nb_{0.93}Ti_{0.07}Fe_{1.01}Sb_{0.99}$ |
| $Nb_{0.93}Ti_{0.07}FeSb$ | $Nb_{0.92}Ti_{0.08}Fe_{0.99}Sb_{1.01}$ |
| $Nb_{0.9}Ti_{0.1}FeSb$ | $Nb_{0.90}Ti_{0.11}Fe_{1.00}Sb_{0.99}$ |
| $Nb_{0.8}Ti_{0.2}FeSb$ | $Nb_{0.81}Ti_{0.19}Fe_{1.02}Sb_{0.99}$ |
| $Nb_{0.7}Ti_{0.3}FeSb$ | $Nb_{0.68}Ti_{0.31}Fe_{1.02}Sb_{0.98}$ |

By increasing the hot pressing temperature up to 1373 K in half-Heuslers $Nb_{1-x}Ti_xFeSb$ (x=0.04, 0.05, 0.06, 0.07, 0.1, 0.2, and 0.3), the hot-pressed grain size is increases, resulting in higher carrier mobility and ultimately higher electrical conductivity and much higher power factor. The highest power factor of ~106 µW cm$^{-1}$ K$^{-2}$ has been achieved in $Nb_{0.95}Ti_{0.05}FeSb$. The high power factor resulted in an record output power density of ~22 W cm$^{-2}$ measured with the cold side and hot side temperatures of 293 K and 868 K, respectively. Such a high output power density is beneficial for large-scale thermoelectric power generation applications.

Figure 9:
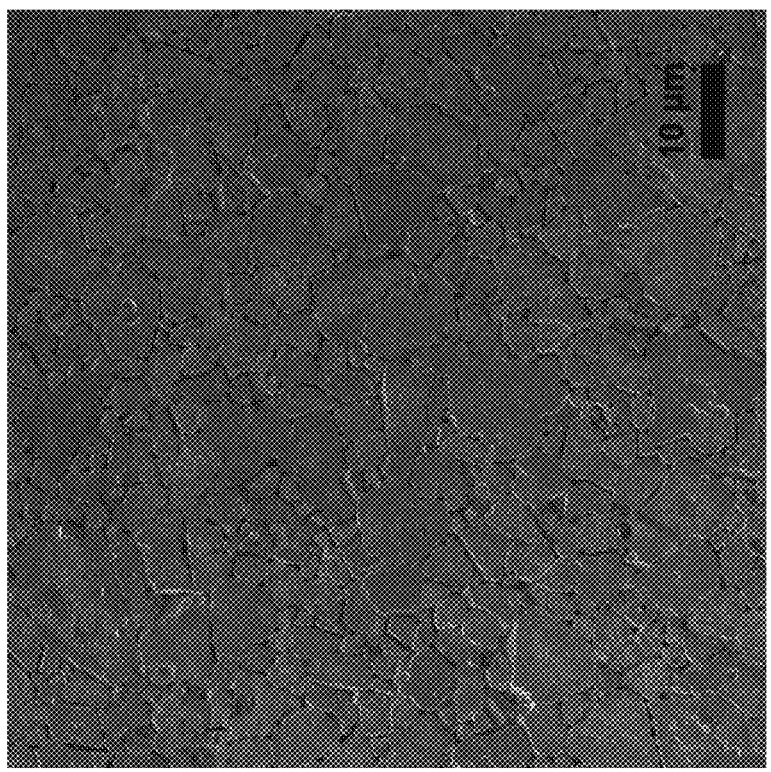
FIG. 9 is an image of an etched surface of $Nb_{0.95}Ti_{0.05}FeSb$ fabricated according to certain embodiments of the present disclosure.

FIG. 9 is an image of an etched surface of $Nb_{0.95}Ti_{0.05}FeSb$ fabricated according to certain embodiments of the present disclosure. In particular, FIG. 9 illustrates a sample of $Nb_{0.95}Ti_{0.05}FeSb$ pressed at 1373 K that has been first polished by alumina sandpapers with a roughness of about 1 µm. The samples were subsequently fine-polished by about a 50 nm $SiO_2$ suspension on a Vibromet machine, resulting in a surface roughness in the order of 10 nm. The smooth surface was then etched for 10 to 15 seconds using etchant containing 50 ml distilled water, 1 ml HF acid (38%), 2 ml $H_2O_2$ (35%).

Figure 10A:
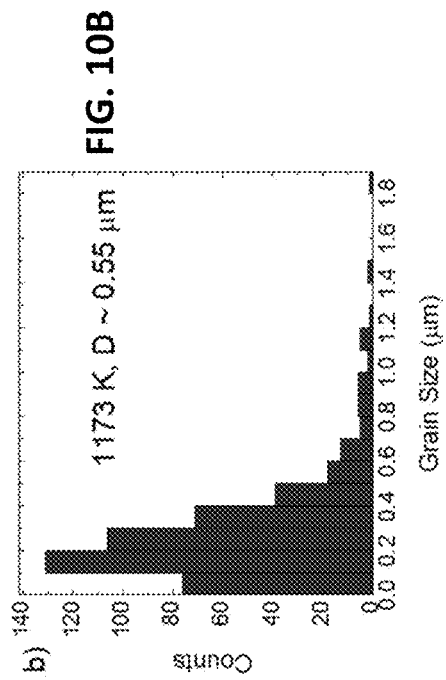
FIGS. 10A-10D are statistic grain sizes analyses of $Nb_{0.95}Ti_{0.05}FeSb$ pressed at 1123 K (FIG. 10A), 1173 K (FIG. 10B), 1273 K (FIG. 10C) and 1373 K (FIG. 10D) for samples fabricated according to certain embodiments of the present disclosure.
Figure 10B:
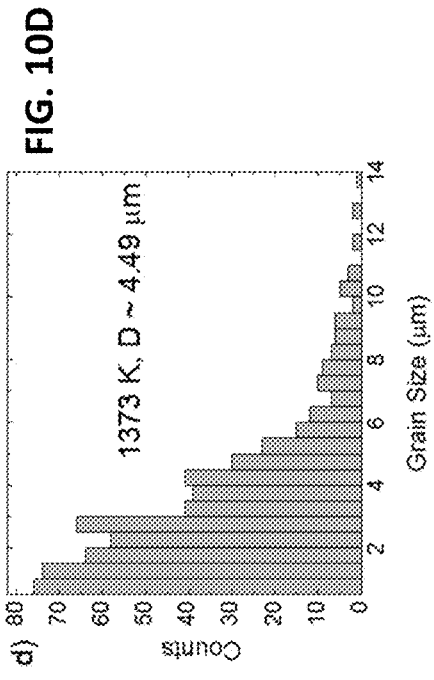
Figure 10C:
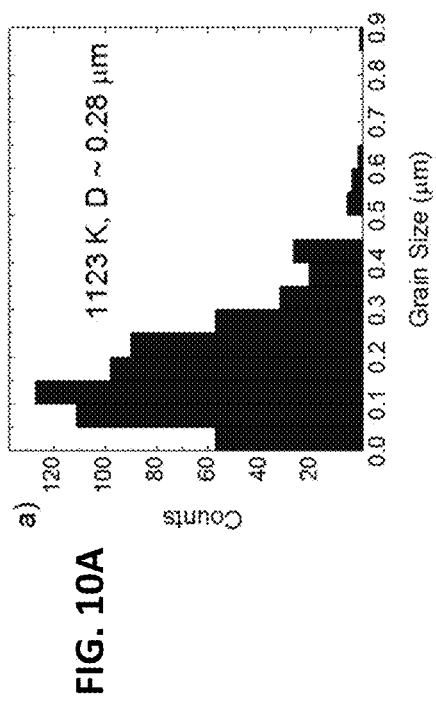
Figure 10D:
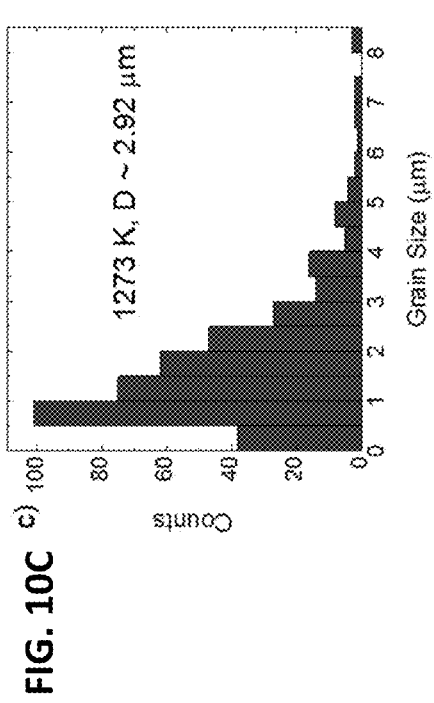

FIGS. 10A-10D are statistic grain sizes analyses of $Nb_{0.95}Ti_{0.05}FeSb$ pressed at 1123 K (FIG. 10A), 1173 K (FIG. 10B), 1273 K (FIG. 10C) and 1373 K (FIG. 10D). The average size is area-weighed, thus larger grains have larger weight when averaging. The average grain size increases with increasing hot-pressing temperature, with grain sizes ranging up to 0.9 µm at a hot pressing temperature of 1123 K in FIG. 10A, and an average grain size of 0.28 µm. Grains formed subsequent to the 1173 K hot-pressing temperature in FIG. 10B are up to 1.8 µm with an average size of about 0.55 µm. FIG. 10C illustrates the distribution of grain sizes for grains formed subsequent to the 1273 K hot-pressing temperature are up to about 8 µm with an average size of about 0.2.92 µm, and FIG. 10D illustrates the distribution of grain sizes formed subsequent to the 1373 K hot-pressing temperature, the average grain size is about 4.49 µm and the grains range in size up to about 14 µm.

FIG. 11A is a cumulative grain size distribution of $Nb_{0.95}Ti_{0.05}FeSb$ pressed at 1123 K, 1173 K, 1273 K and 1373 K that reflects the data illustrated in FIGS. 10A-10D.

Figure 11B:
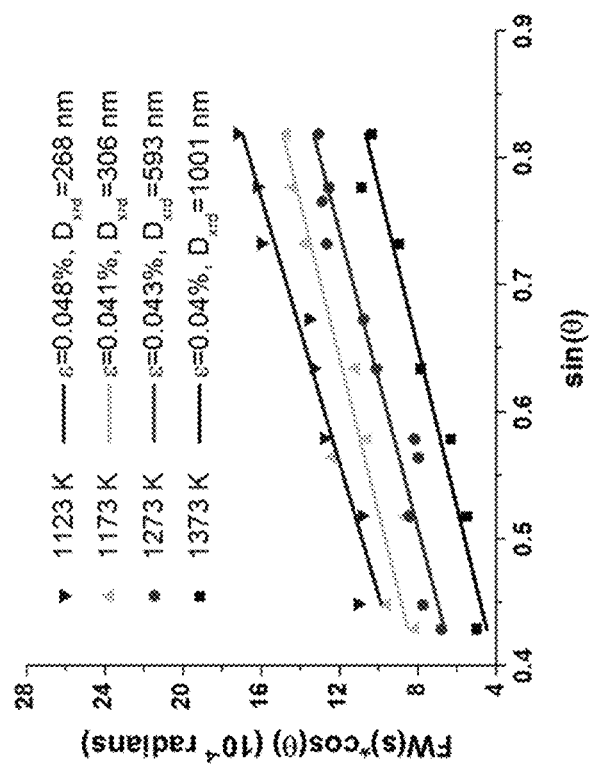
FIG. 11B is a Williamson-Hall plot of grain size vs. strain for thermoelectric materials fabricated according to certain embodiments of the present disclosure

FIG. 11B is a Williamson-Hall plot of grain size vs. strain for thermoelectric materials fabricated according to certain embodiments of the present disclosure. The grain size and strain from x-ray diffraction (XRD) spectra were analyzed using the full width at half maximum (FWHM) broadening using equation (20), $$FW(S)*\cos(\theta) = (FW - FW(I))*\cos(\theta) = \frac{0.94\lambda}{D_{xrd}} + 4\varepsilon\sin(\theta) \quad (20)$$

$D_{xrd}$ is the effective grain size, ε is the strain. λ and θ are the wavelength and diffraction angles, respectively. FW(I) is the instrumental broadening, which is calibrated using a standard Si sample. Thus a plot of FW(S)*cos(θ) with respect to sin(θ) should be a straight line of which the intercept and slope are related with the size and strain, respectively.

Figure 11C:
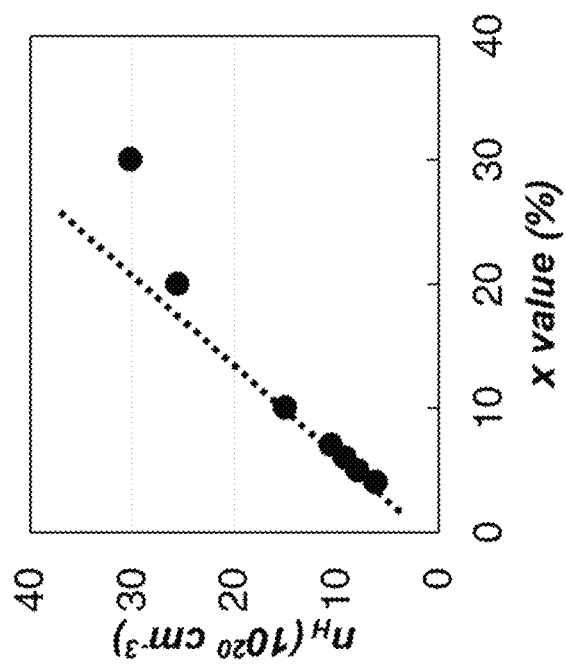
FIG. 11C is a graph of the Hall carrier concentration ($n_H$) variation with the amount of dopants in $Nb_{1-x}Ti_xFeSb$ fabricated according to certain embodiments of the present disclosure.

FIG. 11C is a graph of the Hall carrier concentration ($n_H$) variation with the amount of dopants in $Nb_{1-x}Ti_xFeSb$ fabricated according to certain embodiments of the present disclosure. The dashed line shows the linear relationship of $n_H$ with x when the latter is smaller than 10%. As shown in FIG. 11C, an increase in dopant has a linear relationship with an increase in $n_H$ and continues to increase when x is greater than 10%.

Figure 11D:
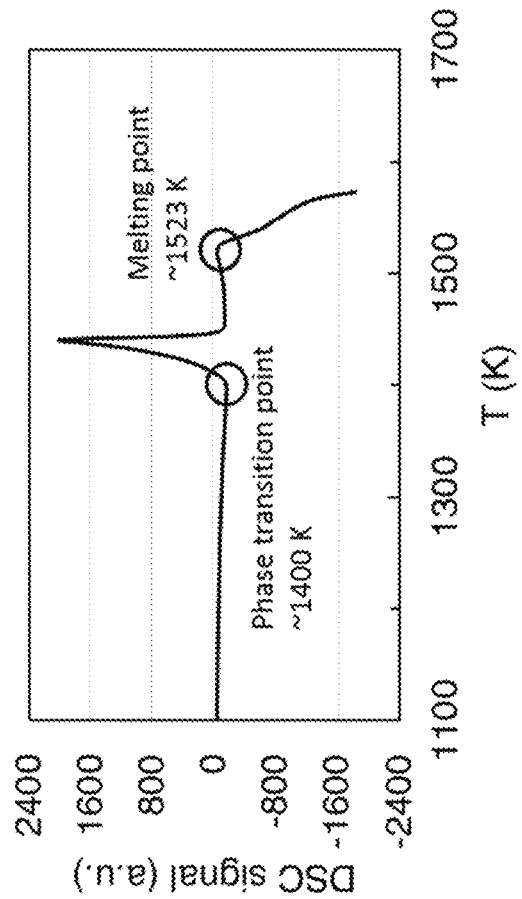
FIG. 11D is a differential scanning calorimetry (DCS) graph of $Nb_{0.95}Ti_{0.05}FeSb$ manufactured according to certain embodiments of the present disclosure.

FIG. 11D is a differential scanning calorimetry (DSS) graph of $Nb_{0.95}Ti_{0.05}FeSb$ samples manufactured according to certain embodiments of the present disclosure. FIG. 11D illustrates DSC measurements up to 1573 K. A phase transition occurs at ~1400 K and the melting point is around 1523 K. Thus, higher temperatures during hot pressing temperature may be beneficial for the TE performance.

Figure 12A:
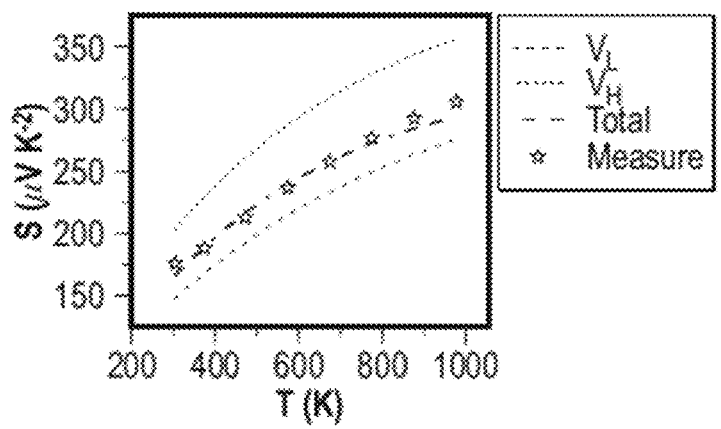
FIGS. 12A-12C show thermoelectric properties for $Nb_{0.95}Ti_{0.05}FeSb$ hot-pressed at 1373 K according to certain embodiments of the present disclosure.
Figure 12B:
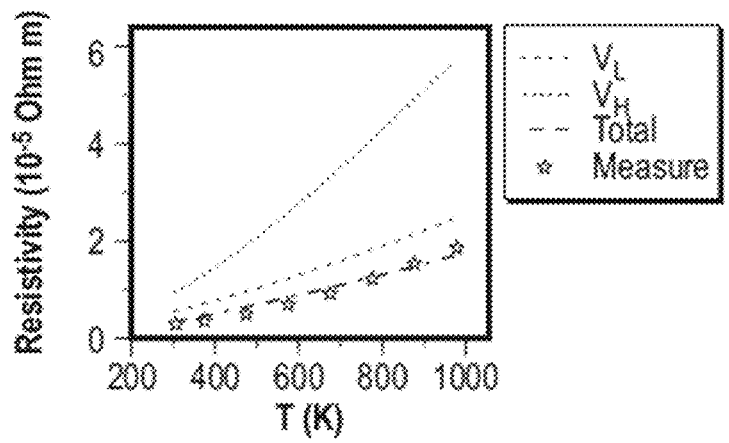
Figure 12C:
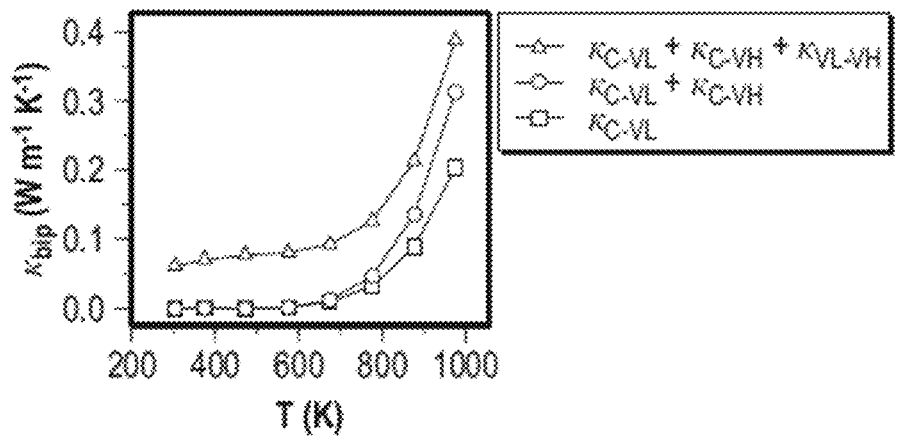

FIGS. 12A-12C show thermoelectric properties for $Nb_{0.95}Ti_{0.05}FeSb$ hot-pressed at 1373 K according to certain embodiments of the present disclosure. FIG. 12A illustrates the Seebeck coefficient and FIG. 12B shows the resistivity of individual branches in the valance band of $Nb_{0.95}Ti_{0.05}FeSb$ pressed at 1373 K. Subscript L and H means the light and heave bands, respectively. FIG. 12C shows the bipolar thermal conductivity among different bands. $\kappa_{C-VL}$, $\kappa_{C-VH}$ and $\kappa_{VL-VH}$ are the bipolar thermal conductivity between conduction-$V_L$ band; conduction-$V_H$ band; and $V_L$ band-$V_H$ band, respectively.

Figure 13:
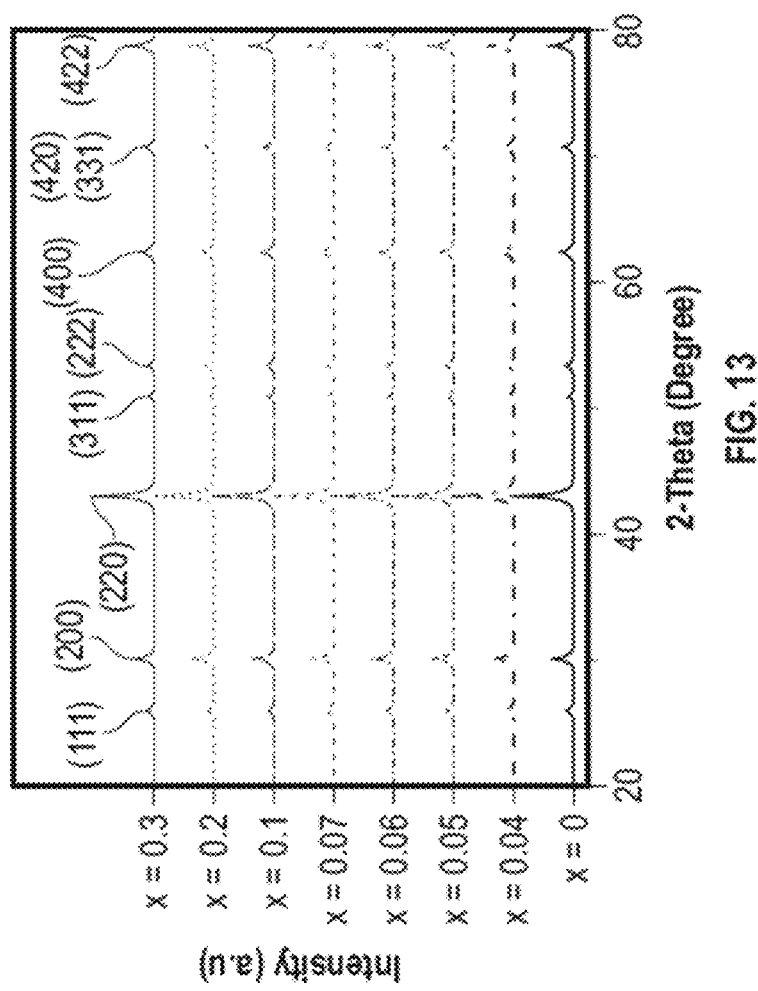
FIG. 13 is an x-ray diffraction (XRD) pattern of $Nb_{1-x}Ti_xFeSb$ fabricated according to certain embodiments of the present disclosure.

FIG. 13 is an x-ray diffraction (XRD) pattern of $Nb_{1-x}Ti_xFeSb$ fabricated according to certain embodiments of the present disclosure. The values for x, as noted in FIG. 13, range from 0 to 0.3.

Figure 14B:
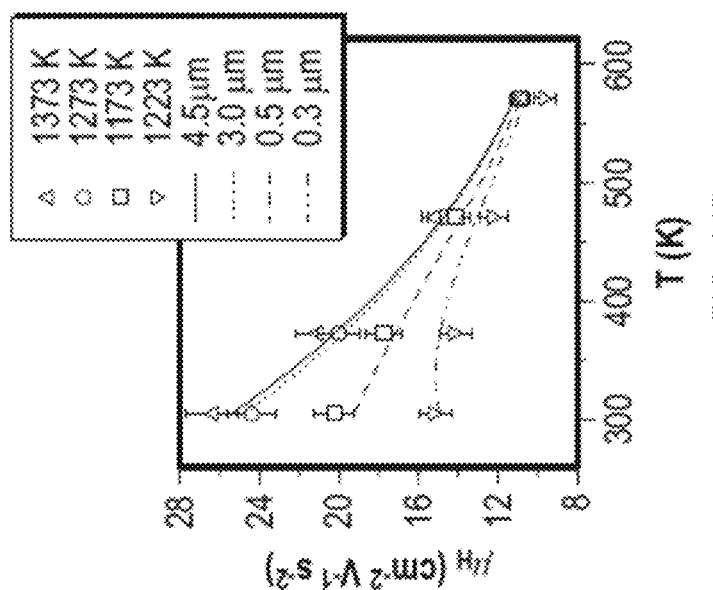
FIGS. 14A and 14B illustrate the effect of grain size on lattice thermal conductivity and hole mobility for $Nb_{1-x}Ti_xFeSb$ fabricated according to certain embodiments of the present disclosure.
Figure 14A:
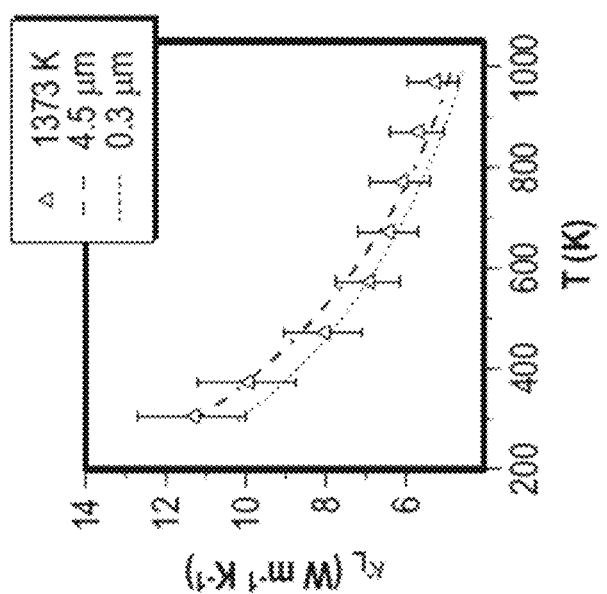

FIG. 14A illustrates the effect of grain size on the lattice thermal conductivity ($\kappa_L$), which increases with increasing grain size, it is appreciated that the 1373 K data represented the measured values and that the trend lines for 4.5 μm and 0.3 μm are the calculated values.

FIG. 14B illustrates the hole mobility $\mu_H$ which increases with increasing grain size. It is appreciated that the 1123, 1173, 1273, and 1373 K data represented are the measured values and that the trend lines for 4.5 μm, 3.0 μm, 0.5 μm, and 0.3 μm are the calculated values.

Figure 15B:
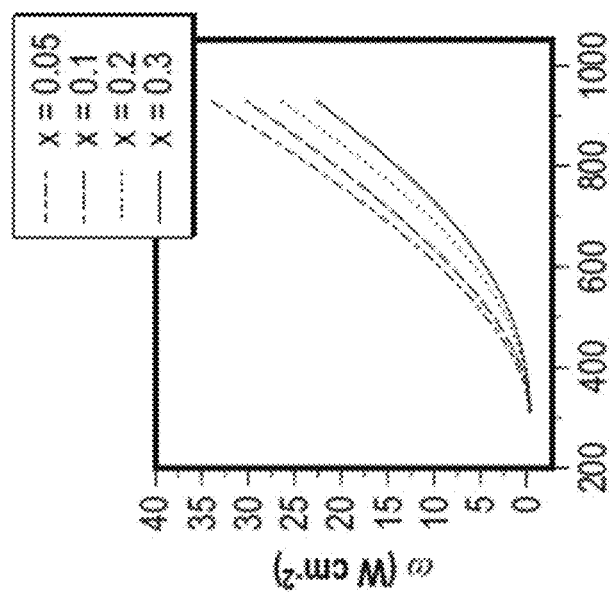
FIGS. 15A and 15B illustrate the power factor and calculated power output density for $Nb_{1-x}Ti_xFeSb$ fabricated according to certain embodiments of the present disclosure.
Figure 15A:
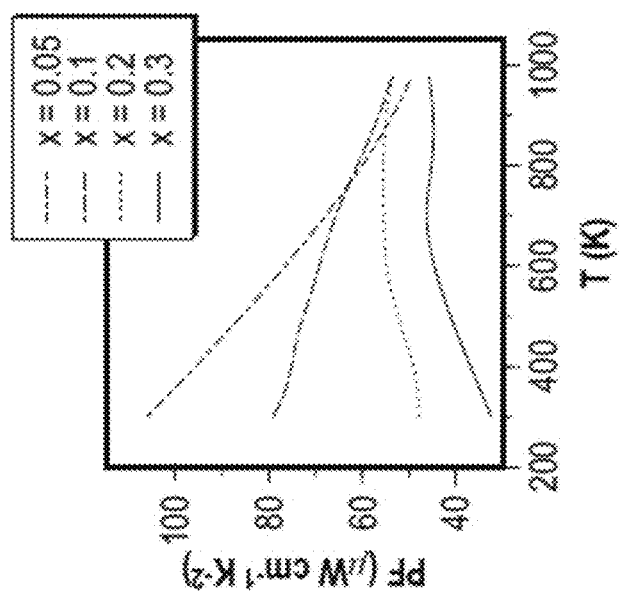

FIGS. 15A and 15B illustrate the power factor (FIG. 15A) and calculated power output density (FIG. 15B) for $Nb_{1-x}Ti_xFeSb$ fabricated according to certain embodiments of the present disclosure. The cold side temperature used for the calculations was 323 K.

Thus, a higher hot pressing temperature up to 1373 K generated a higher carrier mobility and a larger grain size, which lead to a much higher power factor (PF) of ~106 μW $cm^{-1}$ $K^{-2}$ in p-type half-Heusler $Nb_{0.95}Ti_{0.05}FeSb$. With such a high power factor, a record output power density of ~22 W $cm^{-2}$ may be calculated. The power output measurement confirms that ZT determines the conversion efficiency and PF determines the output power density. Thus PF is equally as desirable as ZT when choosing TE materials for power generation purposes.

Figure 16:
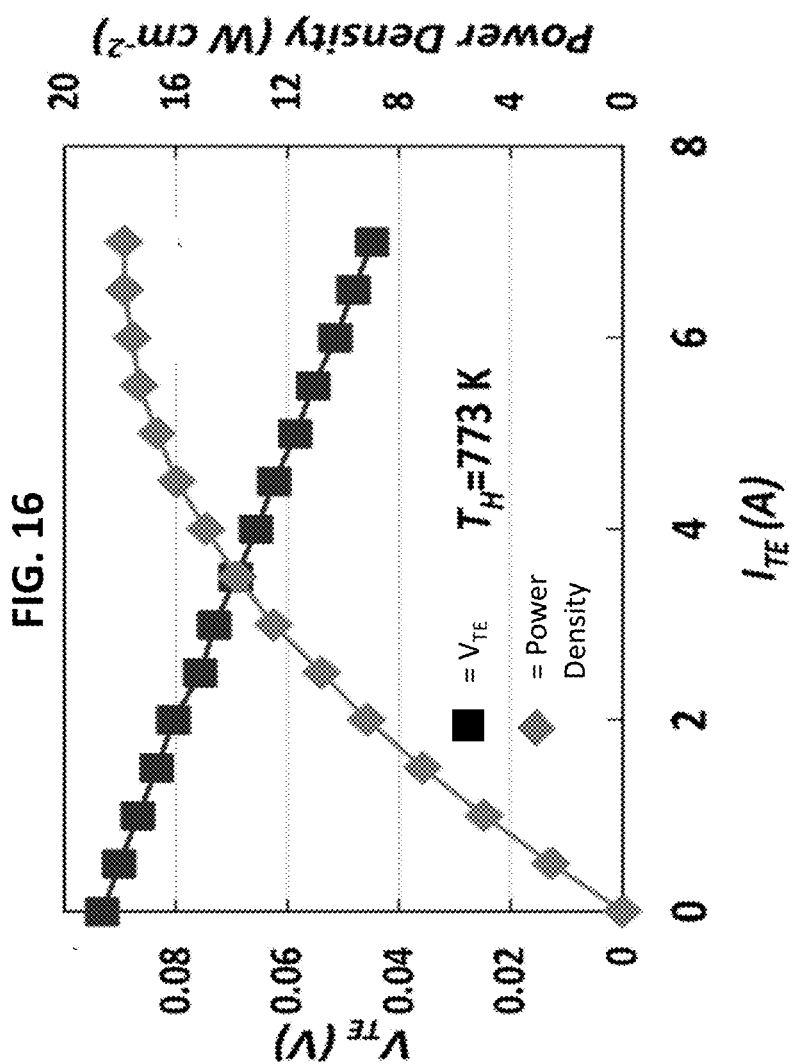
FIG. 16 is a graph of thermoelectric current ($I_{TE}$)-voltage ($V_{TE}$) curve and power output at hot side temperature 773 K for thermoelectric materials fabricated according to embodiments of the present disclosure.

FIG. 16 is a graph of thermoelectric current ($I_{TE}$)-voltage ($V_{TE}$) curve and power output at hot side temperature 773 K for thermoelectric materials fabricated according to embodiments of the present disclosure, including hot-pressing between 1000° C. and 1100° C. For efficiency and power density, the thermoelectric current ($I_{TE}$)-voltage ($V_{TE}$) measurement were performed at various hot side temperature ($T_H$) while the cold side temperature ($T_C$) is maintained at 293 K by a combined cooling from flowing liquid with a thermoelectric module (TEC). The $Nb_{0.95}Ti_{0.05}FeSb$ and $Nb_{0.8}Ti_{0.2}FeSb$ were cut and polished to a size of about 1.3×1.3 $mm^2$ in cross section and about 2 mm in height. Brazing materials ($Ag_{0.78}Cu_{0.22}$, liquidus ~680° C.) were applied on both sides of the polished piece to form a mechanically strong bonding with low electrical resistance to the hot and cold junctions. During measurement the single leg system was vacuumed to below $10^{-4}$ mbar and surrounded by a heated copper shield for minimizing the convection and radiation loss.

Figure 17C:
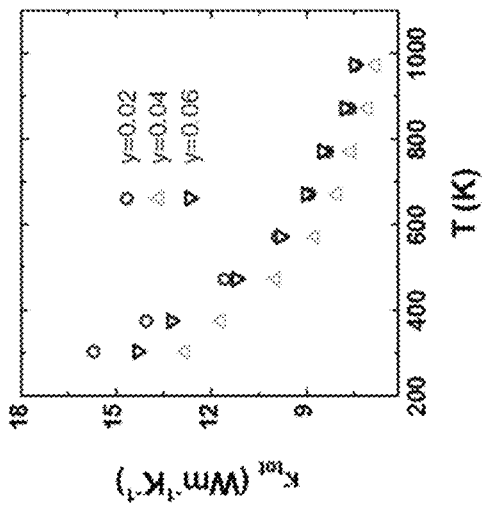
Figure 17D:
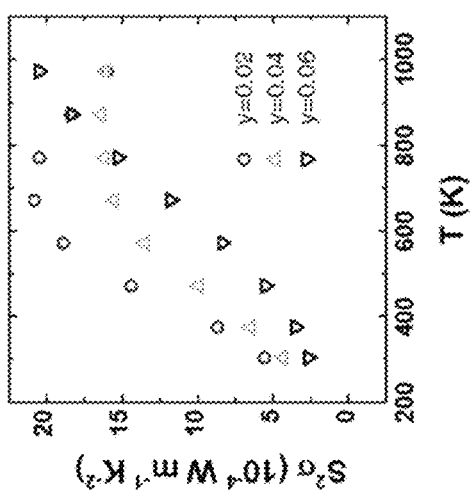
Figure 17E:
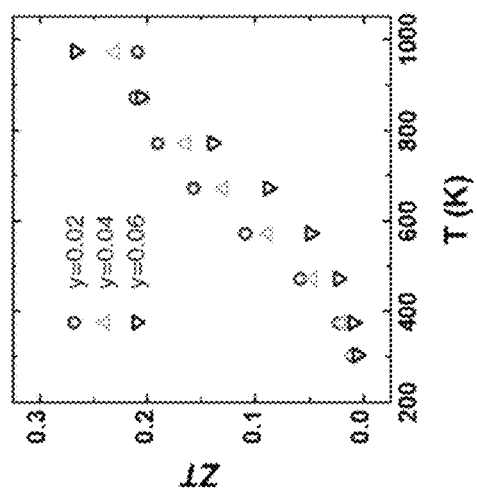

In another example, an Nb-based half-Heusler material was fabricated according to the formula $NbFe_{1-y}Co_ySb$, including hot-pressing between 1000° C. and 1100° C. FIGS. 17A-17E are graphs of thermoelectric properties of n-type $NbFe_{1-y}Co_ySb$ fabricated according to certain embodiments of the present disclosure. In particular, these figures illustrate the electrical conductivity (σ) (FIG. 17A), the Seebeck coefficient (S) (FIG. 17B), the power factor (PF) (FIG. 17C), the total thermal conductivity ($\kappa_{tot}$) (FIG. 17D) and the figure of merit (ZT) (FIG. 17E) of n-type $NbFe_{1-y}Co_ySb$. The total thermal conductivity as shown in FIG. 17D is below about 10.5 from about 480K to about 1000K.

FIGS. 18A and 18B illustrate the temperature dependency of thermoelectric materials fabricated according to certain embodiments of the present disclosure, including hot-pressing between 1000° C. and 1100° C. In some examples, the thermoelectric material may further comprise cobalt according to a formula of $Nb_{1-x}Ti_xFeCoSb$. FIG. 18A shows the temperature dependence of the thermal diffusivity of $Nb_{1-x}Ti_xFeCoSb$ with x=0, 0.04, 0.05, 0.06, 0.07, 0.1, 0.2, and 0.3 and FIG. 18B shows the specific heat of $Nb_{1-x}Ti_xFeCoSb$ with x=0, 0.04, 0.05, 0.06, 0.07, 0.1, 0.2, and 0.3.

While exemplary embodiments of the invention have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order and with any suitable combination of materials and processing conditions.

Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of broader terms such as "comprises," "includes," and "having" should be understood to provide support for narrower terms such as "consisting of," "consisting essentially of," and "comprised substantially of."

While exemplary embodiments of the invention have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order and with any suitable combination of materials and processing conditions.

The invention claimed is:

1. A method of fabricating a thermoelectric component, comprising:
    forming an ingot comprising niobium, iron, antimony, and titanium according to a formula $Nb_{1-x}Ti_xFeSb$;
    ball-milling the ingot to form a ball-milled powder;
    hot-pressing the ball-milled powder between 1100 K and 1400 K to form a thermoelectric component comprising a power factor above about 60 $\mu W\,cm^{-1}\,K^{-2}$ from about 300K to about 775K and comprising a plurality of grains of an average grain size above 1.0 $\mu m$.

2. The method of claim 1, wherein x is from about 0.02 to about 0.7.

3. The method of claim 1, further comprising: subsequent to forming the ingot, melting the ingot at least once and reforming the ingot to enhance a uniformity of the ingot.

4. The method of claim 1, further comprising ball-milling the ingot from 10 minutes to 70 hours.

5. The method of claim 1, further comprising hot-pressing the ball-milled powder to form a plurality of grains of an average grain size from about 0.25 $\mu m$ to about 14 $\mu m$.

6. The method of claim 1, further comprising hot-pressing the ball-milled powder to form the thermoelectric component with a ZT above 0.6 above about 650 K.

7. The method of claim 1, wherein ball-milling comprises more than one cycle.

8. A thermoelectric device comprising:
    a hot-pressed component of ball-milled powder according to a formula $Nb_{1-x}Ti_xFeSb$, wherein the component comprises a power factor above about 60 $\mu W\,cm^{-1}\,K^{-2}$ from about 300 K to about 775 K and an average grain size above 1 $\mu m$.

9. The device of claim 8, wherein x is from 0.02-0.7.

10. The device of claim 8, wherein the power factor of the component is above about 80 $\mu W\,cm^{-1}\,K^{-2}$ from about 300 K to about 500 K.

11. The device of claim 8, further comprising an output power density ($\omega$) of at least 10 $Wcm^{-2}$ above about 600 K.

12. The device of claim 8, further comprising a lattice thermal conductivity ($\kappa_L$) less than 8 $Wm^{-1}K^{-1}$ above about 500 K.

13. The device of claim 8, further comprising a plurality of grains of an average grain size from about 2.5 $\mu m$ to about 4.50 $\mu m$.

14. A thermoelectric device comprising:
    a hot-pressed component of ball-milled powder according to a formula $Nb_{1-x}Ti_xFeSb$, wherein the hot-pressed component comprises a plurality of grains of an average grain size above 1.0 $\mu m$, a ZT above 0.6 above about 650 K, and wherein x is from 0.02 to 0.7.

15. The device of claim 14, wherein the hot-pressed component comprises a total thermal conductivity ($\kappa_{tot}$) of less than about 10 $W\,m^{-1}K^{-1}$ from about 425 K to about 1000 K.

16. The device of claim 15, wherein the hot-pressed component comprises a total thermal conductivity ($\kappa_{tot}$) of less than about 10.5 $Wm^{-1}K^{-1}$ from about 480K to about 1000K.

17. The device of claim 14, wherein a Hall mobility ($\mu_H$) of the hot-pressed component is above 16 $cm^2V\,s^{-2}$ from about 300K to about 450K.

18. The device of claim 14, wherein x is from 0.1 to 0.5.

19. The thermoelectric device of claim 14, wherein the hot-pressed component comprises a power factor above about 60 $\mu W\,cm^{-1}K^{-2}$ from about 300K to about 775K.

20. The device of claim 14, further comprising a plurality of grains of an average grain size from about 2.5 $\mu m$ to about 4.50 $\mu m$.

* * * * *